United States Patent
Mima et al.

(10) Patent No.: US 9,825,209 B2
(45) Date of Patent: Nov. 21, 2017

(54) ELECTRONIC COMPONENT PACKAGE AND METHOD FOR MANUFACTURING THE SAME

(71) Applicant: Panasonic Intellectual Property Management Co., Ltd., Osaka (JP)

(72) Inventors: Kazuma Mima, Osaka (JP); Seiichi Nakatani, Osaka (JP); Yoshihisa Yamashita, Kyoto (JP); Koji Kawakita, Nara (JP); Susumu Sawada, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 14/422,972

(22) PCT Filed: Dec. 20, 2013

(86) PCT No.: PCT/JP2013/007505
§ 371 (c)(1),
(2) Date: Feb. 20, 2015

(87) PCT Pub. No.: WO2014/097645
PCT Pub. Date: Jun. 26, 2014

(65) Prior Publication Data
US 2015/0221842 A1   Aug. 6, 2015

(30) Foreign Application Priority Data
Dec. 21, 2012   (JP) .................................. 2012-279972

(51) Int. Cl.
*H01L 23/48*   (2006.01)
*H01L 21/00*   (2006.01)
(Continued)

(52) U.S. Cl.
CPC .......... *H01L 33/62* (2013.01); *H01L 21/4846* (2013.01); *H01L 33/52* (2013.01);
(Continued)

(58) Field of Classification Search
CPC . H01L 2224/48091; H01L 2224/73265; H01L 2224/0346; H01L 2224/03462;
(Continued)

(56) References Cited

U.S. PATENT DOCUMENTS 3,654,097 A * 4/1972 Degnan .................. H05K 3/428
                                                                174/256
3,934,073 A * 1/1976 Ardezzone .......... H01L 23/3107
                                                                174/549
(Continued)

FOREIGN PATENT DOCUMENTS

JP   01098237 A  *  4/1989
JP   5-121615       5/1993
(Continued)

OTHER PUBLICATIONS

English translation of the International Preliminary Report on Patentability dated Jun. 23, 2015 in International (PCT) Application No. PCT/JP2013/007505.

(Continued)

*Primary Examiner* — Teresa M Arroyo
(74) *Attorney, Agent, or Firm* — Wenderoth, Lind & Ponack, L.L.P.

(57) ABSTRACT

A method for manufacturing an electronic component package. The method includes (i) providing a package precursor in which an electronic component is embedded such that an electrode of the electronic component is exposed at a surface of a sealing resin layer; (ii) forming a first metal plating layer such that the first metal plating layer is in contact with the exposed surface of the electrode of the electronic compo-
(Continued)

Separate spacer means with respect to first metal plating layer and metal foil

Spacer means integrated with first metal plating layer nent; (iii) disposing a metal foil in face-to-face spaced relationship with respect to the first metal plating layer; and (iv) forming a second metal plating layer. In step (iv), the second metal plating layer is formed so as to fill a clearance between the first metal plating layer and the metal foil, thereby integrating the metal foil, the first metal plating layer and the second metal plating layer with each other.

14 Claims, 14 Drawing Sheets

(51) Int. Cl.
| | | |
|---|---|---|
| H01L 33/00 | (2010.01) | |
| H01L 23/02 | (2006.01) | |
| H01L 23/52 | (2006.01) | |
| H01L 29/40 | (2006.01) | |
| C25D 7/12 | (2006.01) | |
| C25D 11/32 | (2006.01) | |
| H01L 33/62 | (2010.01) | |
| H01L 33/64 | (2010.01) | |
| H01L 21/48 | (2006.01) | |
| H01L 33/52 | (2010.01) | |
| H01L 21/768 | (2006.01) | |
| H01L 21/56 | (2006.01) | |

(52) U.S. Cl.
CPC ............. *H01L 33/64* (2013.01); *H01L 21/56* (2013.01); *H01L 21/76873* (2013.01); *H01L 21/76874* (2013.01); *H01L 21/76877* (2013.01); *H01L 21/76879* (2013.01); *H01L 23/481* (2013.01); *H01L 2224/0346* (2013.01); *H01L 2224/03462* (2013.01); *H01L 2224/03825* (2013.01); *H01L 2224/2746* (2013.01); *H01L 2224/27462* (2013.01); *H01L 2224/48091* (2013.01); *H01L 2224/73265* (2013.01); *H01L 2924/19105* (2013.01); *H01L 2933/005* (2013.01); *H01L 2933/0033* (2013.01); *H01L 2933/0066* (2013.01); *H01L 2933/0075* (2013.01)

(58) Field of Classification Search
CPC . H01L 2224/03464; H01L 2224/03825; H01L 2224/1146; H01L 2224/11462; H01L 2224/11464; H01L 2224/11825; H01L 2224/2746; H01L 2224/27462; H01L 2224/27464; H01L 2224/27825; H01L 2224/35125; H01L 2224/35825; H01L 2224/43125; H01L 2224/43825; H01L 2924/00014; H01L 2924/19105; H01L 21/4846; H01L 21/56; H01L 21/76873; H01L 21/76874; H01L 2933/0033; H01L 2933/005; H01L 2933/0066; H01L 2933/0075; H01L 33/52; H01L 33/62; H01L 33/64; H01L 2224/8203; H01L 21/76877; H01L 21/76879; H01L 33/56; H01L 33/58; H01L 33/647; H01L 23/481; C23C 14/34; C23C 14/5846
USPC ............ 438/26, FOR. 390; 257/99, E21.586
See application file for complete search history.

(56) References Cited

U.S. PATENT DOCUMENTS

| | | | | |
|---|---|---|---|---|
| 4,389,278 A | * | 6/1983 | Kai | .......................... H05K 3/42 156/151 |
| 4,835,067 A | * | 5/1989 | Levine | .................. B32B 15/018 174/565 |
| 4,889,584 A | | 12/1989 | Wada et al. | |
| 4,935,312 A | * | 6/1990 | Nakayama | ........ H01L 23/49572 174/551 |
| 5,656,550 A | * | 8/1997 | Tsuji | ..................... H01L 21/565 257/786 |
| 5,684,330 A | | 11/1997 | Lee | |
| 6,180,263 B1 | * | 1/2001 | Naoi | ..................... C23C 28/321 428/634 |
| 6,242,282 B1 | * | 6/2001 | Fillion | ................ H01L 21/4853 257/E21.508 |
| 6,319,834 B1 | | 11/2001 | Erb et al. | |
| 6,452,258 B1 | * | 9/2002 | Abys | ................. H01L 23/49582 257/666 |
| 6,453,549 B1 | | 9/2002 | Bhatt et al. | |
| 6,475,877 B1 | | 11/2002 | Saia et al. | |
| 6,566,258 B1 | | 5/2003 | Dixit et al. | |
| 6,699,782 B2 | | 3/2004 | Kim | |
| 7,132,020 B2 | * | 11/2006 | Nozawa | .................... B23K 1/00 148/400 |
| 7,202,107 B2 | | 4/2007 | Fuergut et al. | |
| 7,285,446 B2 | * | 10/2007 | Shibata | ................. H01L 21/563 257/783 |
| 7,416,763 B2 | | 8/2008 | Kanda et al. | |
| 7,435,910 B2 | * | 10/2008 | Sakamoto | ........... H01L 21/4846 174/260 |
| 7,855,389 B2 | | 12/2010 | Ishikura et al. | |
| 7,927,922 B2 | | 4/2011 | Shen et al. | |
| 8,062,537 B2 | | 11/2011 | Tuominen et al. | |
| 8,114,712 B1 | | 2/2012 | McConnelee et al. | |
| 8,237,259 B2 | | 8/2012 | Pressel et al. | |
| 8,240,032 B2 | | 8/2012 | Iihola et al. | |
| 8,699,233 B2 | | 4/2014 | Palm et al. | |
| 2003/0026078 A1 | * | 2/2003 | Komatsubara | ....... G11B 5/4853 361/746 |
| 2003/0060041 A1 | | 3/2003 | Datta et al. | |
| 2005/0097735 A1 | * | 5/2005 | Kanda | .................... H05K 3/388 29/829 |
| 2006/0006404 A1 | | 1/2006 | Ibbetson et al. | |
| 2006/0219428 A1 | * | 10/2006 | Chinda | .................. H05K 3/421 174/257 |
| 2007/0267136 A1 | | 11/2007 | Tuominen et al. | |
| 2008/0148563 A1 | * | 6/2008 | Sakamoto | ............. H01L 21/568 29/852 |
| 2008/0261338 A1 | | 10/2008 | Iihola et al. | |
| 2008/0284012 A1 | * | 11/2008 | Okayama | ........... H01L 21/4828 257/737 |
| 2008/0314867 A1 | | 12/2008 | Woychik et al. | |
| 2008/0318027 A1 | | 12/2008 | Woychik et al. | |
| 2008/0318055 A1 | | 12/2008 | Fillion et al. | |
| 2009/0027204 A1 | | 1/2009 | Fujimaki et al. | |
| 2009/0196010 A1 | * | 8/2009 | Nakasato | ........... H01L 21/4846 361/820 |
| 2009/0275257 A1 | | 11/2009 | Sun et al. | |
| 2009/0289362 A1 | * | 11/2009 | Rhyner | ................. H01L 21/563 257/738 |
| 2010/0155925 A1 | | 6/2010 | Kunimoto et al. | |
| 2011/0061909 A1 | | 3/2011 | Palm et al. | |
| 2011/0175213 A1 | | 7/2011 | Mori et al. | |
| 2012/0040840 A1 | * | 2/2012 | Okayama | ........... H01L 39/2454 505/230 |
| 2012/0218721 A1 | | 8/2012 | Nishimura | |
| 2012/0223789 A1 | | 9/2012 | Inoue et al. | |
| 2012/0325531 A1 | * | 12/2012 | Okouchi | .................. H05K 3/4602 174/257 |
| 2013/0056250 A1 | * | 3/2013 | Chung | .................... H05K 3/427 174/255 |
| 2013/0249080 A1 | | 9/2013 | Lin et al. | |
| 2014/0210090 A1 | | 7/2014 | Palm et al. | |
| 2015/0076545 A1 | | 3/2015 | Nakatani et al. | |

FOREIGN PATENT DOCUMENTS

| | | |
|---|---|---|
| JP | 9-64247 | 3/1997 |
| JP | 10-223832 | 8/1998 |
| JP | 2001-250888 | 9/2001 |
| JP | 2002-170921 | 6/2002 |
| JP | 2003239082 A * | 8/2003 |

(56) References Cited

FOREIGN PATENT DOCUMENTS

| | | |
|---|---|---|
| JP | 2005-19754 | 1/2005 |
| JP | 2006-165322 | 6/2006 |
| JP | 2008-503076 | 1/2008 |
| JP | 2008-522396 | 6/2008 |
| JP | 2009-253284 | 10/2009 |
| JP | 2010-80528 | 4/2010 |
| JP | 2011-134817 | 7/2011 |
| JP | 2011-523773 | 8/2011 |
| JP | 2012-109306 | 6/2012 |
| JP | 2012-134500 | 7/2012 |
| WO | 2010/018708 | 2/2010 |
| WO | 2011/062252 | 5/2011 |

OTHER PUBLICATIONS

English translation of the International Preliminary Report on Patentability dated Jun. 23, 2015 in International (PCT) Application No. PCT/JP2013/007504.
English translation of the International Preliminary Report on Patentability dated Jun. 23, 2015 in International (PCT) Application No. PCT/JP2013/007503.
English translation of the International Preliminary Report on Patentability dated Jun. 23, 2015 in International (PCT) Application No. PCT/JP2013/007502.
English translation of the International Preliminary Report on Patentability dated Jun. 23, 2015 in International (PCT) Application No. PCT/JP2013/007501.
Office Action dated Feb. 22, 2016 in U.S. Appl. No. 14/422,294.
Office Action dated Feb. 25, 2016 in U.S. Appl. No. 14/422,615.
International Search Report dated Mar. 18, 2014 in International (PCT) Application No. PCT/JP2013/007502.
International Search Report dated Mar. 18, 2014 in International (PCT) Application No. PCT/JP2013/007501.
International Search Report dated Mar. 18, 2014 in International (PCT) Application No. PCT/JP2013/007503.
International Search Report dated Mar. 18, 2014 in International (PCT) Application No. PCT/JP2013/007504.
International Search Report dated Mar. 18, 2014 in International (PCT) Application No. PCT/JP2013/007505.
Office Action dated Dec. 4, 2015 in U.S. Appl. No. 14/422,505.
Office Action dated May 5, 2016 in U.S. Appl. No. 14/422,990.
Office Action dated Mar. 20, 2017 in corresponding Chinese patent application No. 201380043805.8 (with English translation).

* cited by examiner

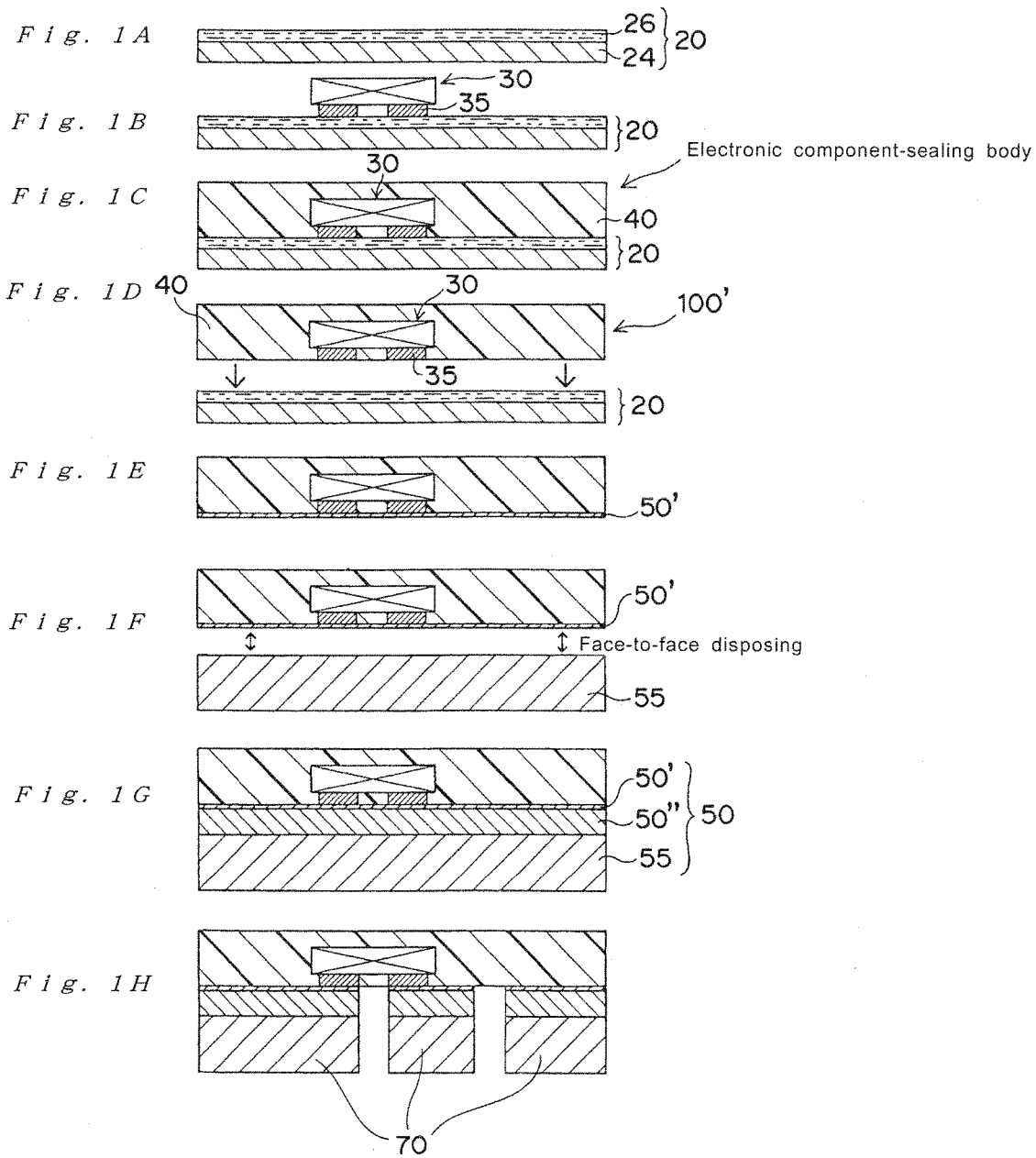

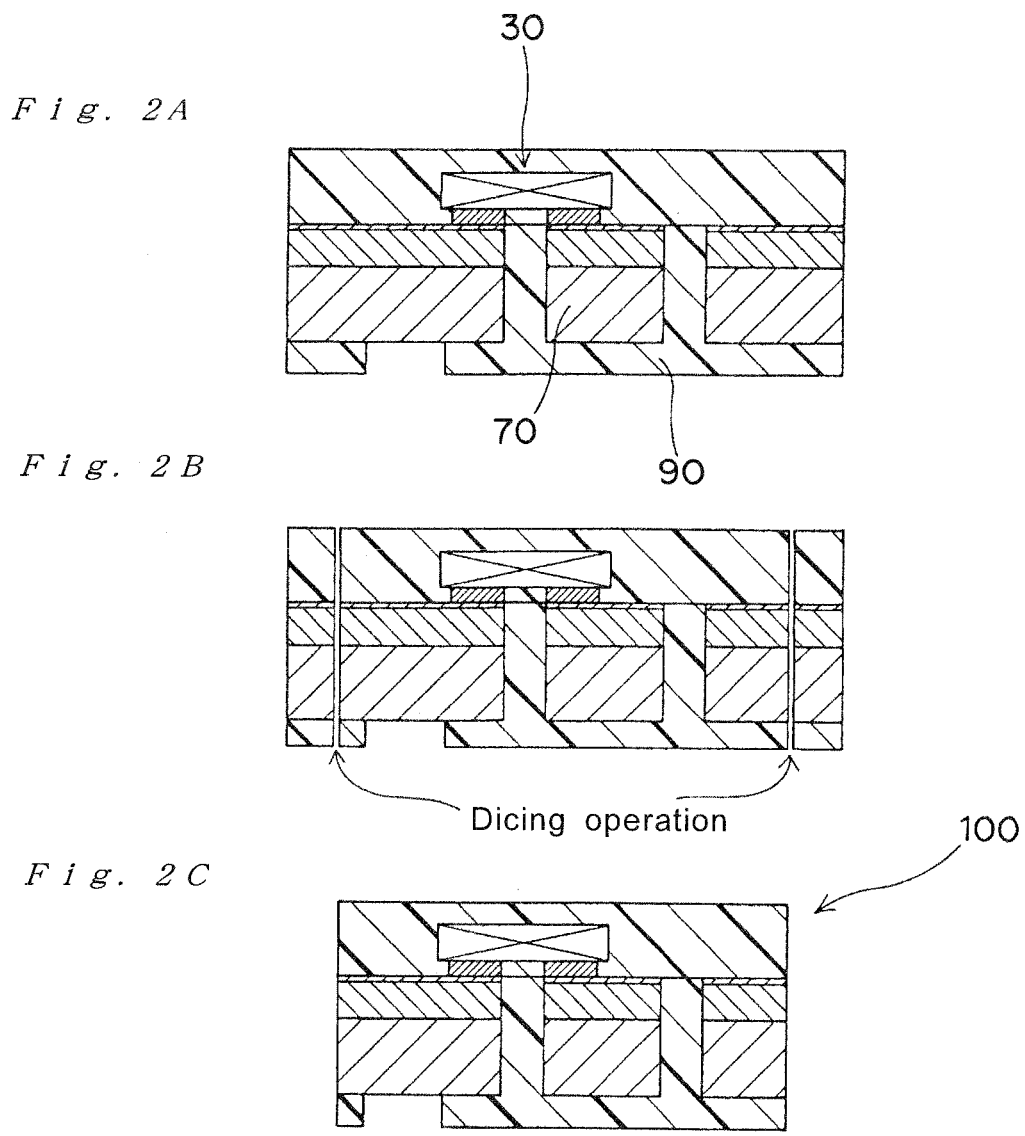

Separate spacer means with respect to first metal plating layer and metal foil

Spacer means integrated with first metal plating layer

Spacer means integrated with metal foil

Wide through-hole    Narrow through-hole

Height of plating: Low    Height of plating: High

Infiltration of plating solution

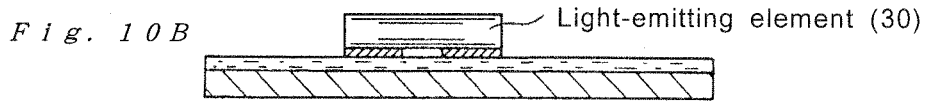
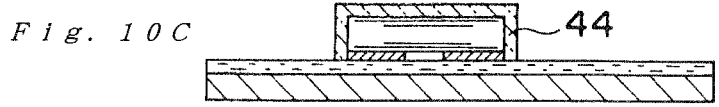
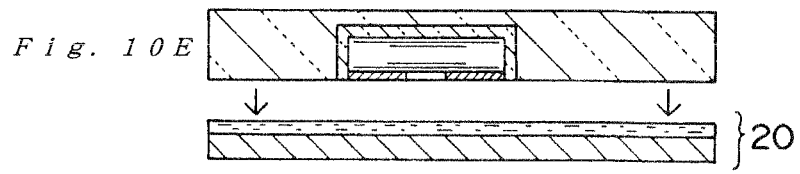
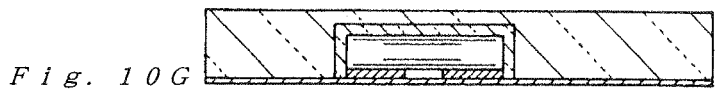
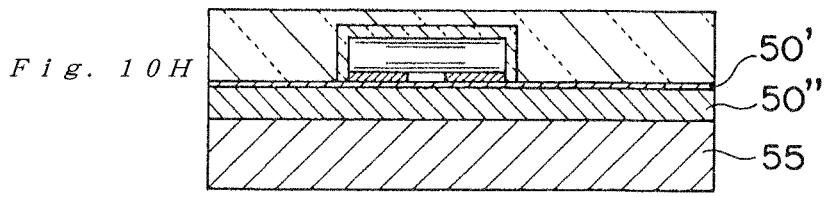
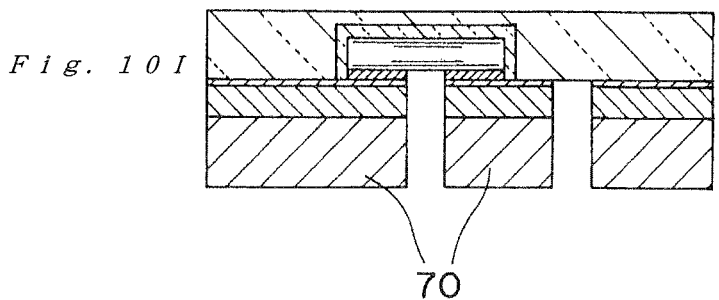

Second metal plating layer
extending locally through metal foil

Package with circuit substrate
(Wiring-bonding type / Flip-chip type)

Package with lead frame

ELECTRONIC COMPONENT PACKAGE AND METHOD FOR MANUFACTURING THE SAME

TECHNICAL FIELD

The present disclosure relates to an electronic component package and a method for manufacturing the electronic component package. More particularly, the present disclosure relates to a package product equipped with an electronic component, and a method for manufacturing such package product.

BACKGROUND OF THE INVENTION

With the advance of electronic devices, various package technologies have been developed in the electronics field. For example, a packaging (i.e., packaging technique) using a circuit substrate or a lead frame has been developed for a mounting of electronic components such as IC and inductor. That is, there have been used "package with circuit substrate" and "package with lead frame" as a general package form for the electronic component.

"Package with circuit substrate" (see FIG. 16A) has such a form that the electronic component has been mounted on the circuit substrate. This package is generally classified as "Wire Bonding type (W/B type)" and "Flip Chip type (F/C type)". While on the other hand, "package with lead frame" (see FIG. 16B) has such a form that a lead frame, which may be composed of a lead or die pad, is included therein. In this lead frame-type package as well as the circuit substrate-type package, a bonding of the various electronic components is provided by a soldering or the like.

PATENT DOCUMENTS

Prior Art Patent Documents

PATENT DOCUMENT 1: U.S. Pat. No. 7,927,922
PATENT DOCUMENT 2: U.S. Pat. No. 7,202,107
PATENT DOCUMENT 3: JP2008-522396

DISCLOSURE OF THE INVENTION

Problems to be Solved by the Invention

The technologies of the prior art cannot provide a satisfactory performance in terms of a heat releasing and a connection reliability in a high-density packaging.

Under the above circumstances, an embodiment of the present invention has been created. In other words, an object of an embodiment of the present invention is to provide an electronic component package and a manufacturing method therefor, which can achieve an improvement of the heat-releasing performance and the connection reliability in the high-density packaging.

Means for Solving the Problem

In order to achieve the above-mentioned object, an embodiment of the present invention provides a method for manufacturing an electronic component package, the method comprising the steps of:

(i) providing a package precursor in which an electronic component is embedded such that an electrode of the electronic component is exposed at a surface of a sealing resin layer;

(ii) forming a first metal plating layer such that the first metal plating layer is in contact with the exposed surface of the electrode of the electronic component;

(iii) disposing a metal foil in face-to-face spaced relationship with respect to the first metal plating layer; and (iv) forming a second metal plating layer, wherein, in the step (iv), the second metal plating layer is formed to fill a clearance between the first metal plating layer and the metal foil with the second metal plating layer, and thereby integrating the metal foil, the first metal plating layer and the second metal plating layer with each other.

Furthermore, an embodiment of the present invention provides an electronic component package, comprising:

a sealing resin layer;
an electronic component buried in the sealing resin layer; and
a metal wiring layer in contact with an electrode of the electronic component, wherein the metal wiring layer is composed of a first metal plating layer, a second metal plating layer and a metal foil, the first metal plating layer being in direct contact with the electrode of the electronic component, the second metal plating layer being in direct contact with the first metal plating layer, the metal foil being in contact with the second metal plating layer, wherein the second metal plating layer is positioned at least between the first metal plating layer and the metal foil.

Effect of the Invention

In accordance with the electronic component package according to an embodiment of the present invention, the metal plating layer is provided so that it is in direct contact with the electronic component, which can achieve the improvement of the heat releasing performance and the connection reliability in the high-density packaging.

BRIEF DESCRIPTION OF THE DRAWINGS

FIGS. 1A to 1H are process-cross sectional views schematically illustrating a manufacturing method of an electronic component package according to an embodiment of the present invention.

FIGS. 2A to 2C are process-cross sectional views schematically illustrating a manufacturing method of an electronic component package according to an embodiment of the present invention.

FIGS. 10A to 10I are process-cross sectional views schematically illustrating a manufacturing method of an electronic component package according to an embodiment (Fourth Embodiment) of the present invention.

DETAILED DESCRIPTION OF THE INVENTION (Findings as Basis for Invention)

The inventors have found out that the conventional packaging technologies mentioned in the paragraph "BACKGROUND OF THE INVENTION" have the following problems.

Figure 16A:
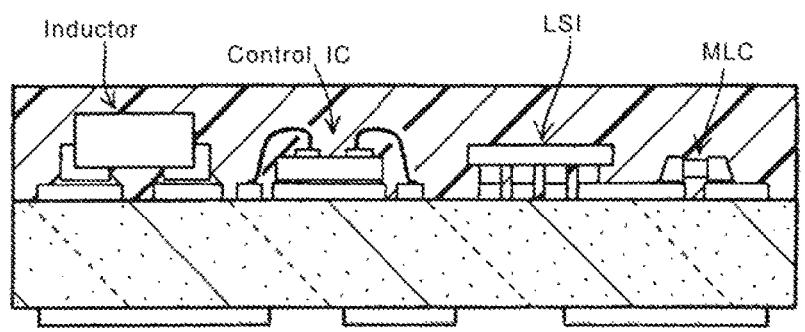
FIGS. 16A and 16B are cross-sectional views schematically illustrating a configurations of an electronic component package of the prior art.

The package technology regarding "package with circuit substrate" (see FIG. 16A) makes it possible to provide a high-density packaging. However, there has been still problems of a heat releasing, the problem being attributed to the presence of the circuit substrate. The cost of the substrate in itself is not negligible, and thus "package with circuit substrate" is not necessarily satisfactory in terms of cost. Furthermore, the cost for a wire bonding or flip-chip mounting is also not negligible, and thus the cost reduction thereof is needed. In this regard, a costly mounter is generally required in the flip-chip mounting.

Figure 16B:
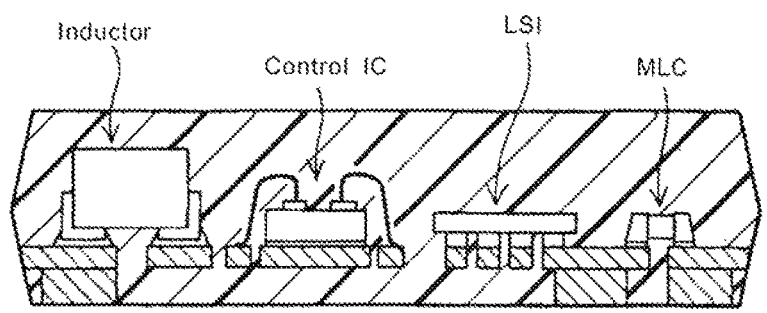

As for the lead frame-type package (see FIG. 16B), the lead frame in itself makes it difficult to provide a fine process. The lead frame-type package is thus not appropriate for the high-density packaging. The lead frame-type package as well as the circuit substrate-type package is associated with the soldering, which could raise a concern about so-called "solder flash" upon the whole sealing with resin material. Due to the solder flash, these packages are not necessarily satisfactory in terms of connection reliability. Specifically, there is such a concern that solder material used for the connection of package components can be re-melted due to the heating of the soldering for module packaging, and thus the re-melted solder material may seeps into the fine interstices (the seeping being referred to "flash"), or may adversely cause a short circuit.

Under the above circumstances, an embodiment of the present invention has been created. In other words, a main object of an embodiment of the present invention is to provide a packaging technology capable of satisfying the desired heat releasing and the connection reliability in the high-density packaging.

Rather than addressing as merely extensions of the conventional arts, the inventors tried to accomplish the above main object by addressing from a new point of view. As a result, the inventors have created the invention of an electronic component package and a manufacturing method thereof, both of which are capable of achieving the above main object. Specifically, an embodiment of the present invention provides a method for manufacturing an electronic component package, the method comprising the steps of:

(i) providing a package precursor in which an electronic component is embedded such that an electrode of the electronic component is exposed at a surface of a sealing resin layer;

(ii) forming a first metal plating layer such that the first metal plating layer is in contact with the exposed surface of the electrode of the electronic component;

(iii) disposing a metal foil in face-to-face spaced relationship with respect to the first metal plating layer; and (iv) forming a second metal plating layer, wherein, in the step (iv), the second metal plating layer is formed to fill a clearance between the first metal plating layer and the metal foil with the second metal plating layer, and thereby integrating the metal foil, the first metal plating layer and the second metal plating layer with each other.

One of the features of the manufacturing method of the electronic component package according to an embodiment of the present invention is that the second metal plating layer is formed such that a clearance between the first metal plating layer and the metal foil is filled with the second metal plating layer, and thereby the metal foil, the first metal plating layer and the second metal plating layer are integrated with each other.

Furthermore, an embodiment of the present invention also provides an electronic component package, comprising:

a sealing resin layer;

an electronic component buried in the sealing resin layer; and a metal wiring layer in contact with an electrode of the electronic component, wherein the metal wiring layer is composed of a first metal plating layer, a second metal plating layer and a metal foil, the first metal plating layer being in direct contact with the electrode of the electronic component, the second metal plating layer being in direct contact with the first metal plating layer, the metal foil being in contact with the second metal plating layer, and wherein the second metal plating layer is positioned at least between the first metal plating layer and the metal foil.

One of the features of the electronic component package according to an embodiment of the present invention is that the metal wiring layer is composed of three metal layers, i.e., "first metal plating layer in direct contact with the electrode of the electronic component", "second metal plating layer in direct contact with the first metal plating layer" and "metal foil in contact with the second metal plating layer", and that the second metal plating layer is positioned at least between the first metal plating layer and the metal foil.

In accordance with an embodiment of the present invention, the desired heat releasing and connection reliability can be satisfied while achieving the low-cost mounting.

With respect to the "heat-releasing performance" according to an embodiment of the present invention, a mounting with no wire bonding or no bump is provided (that is, there can be provided a wire bonding-less/bump-less package), which enables the heat from the electronic component to be effectively released via the metal wiring layer. In particular, the metal wiring layer according to an embodiment of the present invention can be provided as a thicker layer due to the presence of the metal foil, which can improve the heat-releasing performance. In other words, the first metal plating layer, the second metal plating layer and the metal foil, of which the metal wiring layer is composed, can be made of a material with high thermal conductivity (e.g., copper material), and also can be provided as "metal plating layer having the large thickness". Therefore, an embodiment of the present invention makes it possible to effectively release the heat via the metal wiring layer to the outside thereof.

An embodiment of the present invention can also achieve a packaging with no need of "soldering". As a result, the packaging with no soldering material included therein can be achieved. This makes it possible to avoid the unfavorable "solder flash", which leads to an improvement of the connection reliability.

Furthermore, the package according to an embodiment of the present invention has a "substrate-less structure". The substrate-less structure, i.e., no substrate of the package can contribute to a low-cost manufacturing of the package due to no cost of the substrate. As for such "substrate-less structure", it makes possible to achieve a more simplified packaging process, compared to the wire bonding or flip-chip mounting process. This can also contribute to the low cost manufacturing. Moreover, the use of the metal foil with its large thickness makes it possible to form the metal wiring layer with its large thickness for a shorter period of time, which can also contribute to the low cost manufacturing.

An electronic component package and a manufacturing method thereof according to an embodiment of the present invention will be hereinafter described in more detail. It should be noted that various parts or elements are schematically shown in the drawings wherein their dimensional proportions and their appearances are not necessarily real ones, and are merely illustrated for the purpose of making it easy to understand the present invention.

[Manufacturing Method of the Present Invention]

A method for manufacturing an electronic component package according to an embodiment of the present invention will be described. FIGS. 1A-1H and FIGS. 2A-2C schematically illustrate processes associated with the manufacturing method according to an embodiment of the present invention.

In the manufacturing method according to an embodiment of the present invention, the step (i) is firstly carried out to provide a package precursor. It is preferred that the formation of the package precursor comprises the step for placing the electronic component on an adhesive carrier such that the electronic component is attached to the adhesive carrier, the step for forming a sealing resin layer on the adhesive carrier such that the electronic component is covered with the sealing resin layer, and the step for peeling away the adhesive carrier from the sealing resin layer so that the electrode of the electronic component is exposed at the surface of the sealing resin layer.

Specifically, as shown in FIGS. 1A and 1B, at least one kind of electronic component 30 is placed on an adhesive carrier 20. Namely, the electronic component 30 is mounted on the adhesive carrier 20. It is preferred that the placement of the electronic component 30 is performed such that an electrode 35 thereof makes contact with the adhesive carrier 20. This enables the electrode 35 of the electronic component 30 to be suitably exposed at a later operation of a removal of the carrier.

The electronic component 30 may be any suitable one as long as it is a circuit component/element used in the electronics packaging field. Examples of the electronic component may include an IC (e.g., control IC), an inductor, a semiconductor element (e.g., MOS: metal-oxide semiconductor), a capacitor, a power element, a light-emitting element (e.g., LED), a chip resistor, a chip capacitor, a chip varistor, a chip thermistor and a chip laminate filter, a connection terminal and the like.

The adhesive carrier 20 is a carrier sheet composed of a base and an adhesive layer, for example. As shown in FIG. 1A, the carrier sheet having a two-layered structure in which the adhesive layer 26 is provided on a supporting base 24. In terms of a suitable peeling of the adhesive carrier (the peeling being later performed), it is preferred that the supporting base 24 is flexible.

The supporting base 24 of the carrier sheet may be any suitable sheet-like part as long as it cannot adversely affect "disposing/placing of electronic component" or "formation of sealing resin layer", both of which will be later performed. For example, the material for the supporting base 24 may be a resin, a metal and/or a ceramic. Examples of the resin may include polyester resin (e.g., polyethylene terephthalate, polyethylene naphthalate), acrylic resin (e.g., polymethylmethacrylate), polycycloolefin and polycarbonate. Examples of the metal for the supporting base 24 may include iron, copper, aluminium and alloy thereof. By way of example, the metal may be a stainless material (e.g., SUS). Examples of the ceramic for the supporting base 24 may include apatite, alumina, silica, silicon carbide, silicon nitride, and boron carbide. The thickness of the supporting base is preferably in the range of 0.1 mm to 2.0 mm, more preferably in the range of 0.2 mm to 1.0 mm (for example, 0.2 mm), because of its "sheet-like" form.

While on the other hand, the adhesive layer 26 may be any suitable one as long as it has an adhesive property with respect to the electronic component. For example, the adhesive layer may comprise at least one kind of adhesive material selected from the group consisting of acrylic resin-based adhesive, urethane resin-based adhesive, silicone resin-based adhesive and epoxy resin adhesive. The thickness of the adhesive layer 26 is preferably in the range of 2 µm to 50 µm, more preferably in the range of 5 µm to 20 µm (for example, 10 µm). As the adhesive layer 26, a double-faced adhesive tape may be used. In this regard, the double faced tape wherein an adhesive layer is provided on both principal surfaces of a resin film layer (e.g., PET film) may be used, for example.

Subsequent to the placement of the electronic component 30 onto the adhesive carrier 20, a sealing resin layer 40 is formed on the adhesive carrier 20 such that the electronic component 30 is covered with the sealing resin layer 40 (see FIG. 1O). This results in a production of a precursor 100' of the electronic component package. The formation of the sealing resin layer 40 can be performed by applying a resin material onto an adhesive surface of the adhesive carrier 20 by a spin-coating process or a doctor-blade process, followed by being subjected to a heat treatment or a light-exposure treatment. In other words, the sealing resin layer 40 can be provided by subjecting the applied resin material to a heat or light curing treatment. Alternatively, the sealing resin layer 40 may be provided by putting a resin film on the adhesive surface of the adhesive carrier 20. Furthermore, the sealing resin layer 40 may be provided by filling an uncured powdered or liquid resin into a die, followed by a heat curing thereof.

The material for the sealing resin layer 40 may be any suitable one as long as it exhibits an electrical insulation property. For example, the material of the sealing resin layer may be an epoxy-based resin or a silicone-based resin. The thickness of the sealing resin layer 40 is preferably in the approximate range of 0.5 mm to 5.0 mm, and more preferably in the approximate range of 1.2 mm to 1.8 mm.

Subsequent to the formation of the sealing resin layer, the adhesive carrier 20 is peeled away from the electronic component-sealing body, and thereby the adhesive carrier 20 is removed. The removal of the adhesive carrier enables the electrode 35 of the electronic component 30 to be exposed at the surface of the sealing resin layer 40, which results in a production of the package precursor 100'.

Subsequent to the production of the package precursor 100', the step (ii) is carried out. Namely, as shown in FIG. 1E, a first metal plating layer 50' is formed such that it is in contact with the exposed surface of the electrode of the electronic component. It is preferred that a dry plating process is performed with respect to a principal surface of the sealing resin layer, the surface of the electrode of the electronic component being exposed at the principal surface. This results in a formation of a dry plating layer (first metal plating layer 50') in contact or bond with the exposed surface of the electrode of the electronic component.

Examples of the dry plating process include a vacuum plating process (Physical Vapor Deposition, i.e., PVD process) and a chemical vapor plating process (Chemical Vapor Deposition, i.e., CVD process). Examples of the vacuum plating process include a sputtering process, a vacuum deposition process, and an ion plating process. For example, the sputtering process is performed as the dry plating process to form the first metal plating layer 50' which joints the exposed surface of the electrode of the electronic component.

It is preferred that the first metal plating layer 50' comprises at least one kind of metal material selected from the group consisting of Ti (titanium), Cr (chromium), Ni (nickel), Cu (copper) and Al (aluminum), for example.

The first metal plating layer 50' formed by the dry plating layer, i.e., the dry plating layer is relatively thin. For example, the thickness of the first metal plating layer 50' is preferably in the range of 50 nm to 50 μm, more preferably in the range of 100 nm to 5 μm (for example, about 150 nm).

By way of example, the first metal plating layer 50' is not limited to a single layer, but may be formed as a form of multiple layers. For example, a Ti thin film layer and a Cu thin film layer may be formed as the first metal plating layer. More specifically, the formation of the Ti thin film layer is performed, followed by the formation of the Cu thin film layer, the both formations being performed by the sputtering process.

Subsequent to the step (ii), the step (iii) is carried out. Namely, as shown in FIG. 1F, a metal foil 55 is disposed in face-to-face spaced relationship with respect to the first metal plating layer 50'.

Figure 3A:
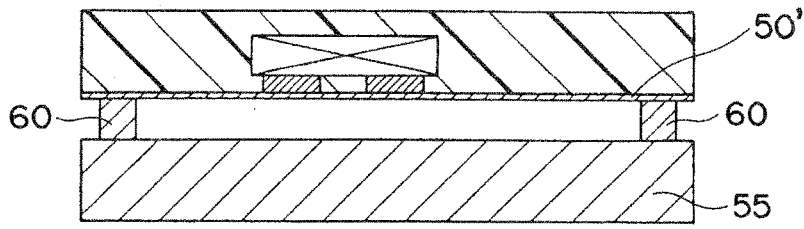
FIGS. 3A to 3C are sectional views schematically illustrating embodiments wherein a spacer means is used.

Upon the face-to-face spaced disposing of the metal foil 55, a spacer means 60 may be used as shown in FIG. 3A. Namely, a local interposition of the spacer means 60 between the first metal plating layer 50' and the metal foil 55 may be performed to dispose the metal foil 55 in face-to-face spaced relationship with respect to the first metal plating layer 50'.

Figure 3B:
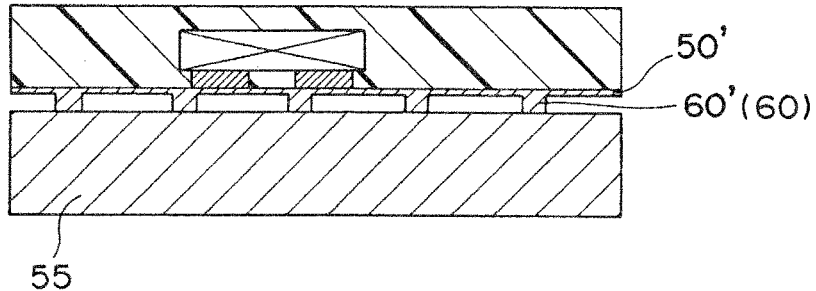
Figure 3C:
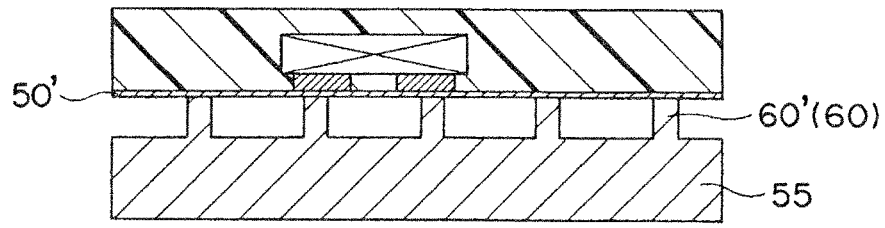

The spacer means 60 may be a separate part which is different from the first metal plating layer 50' and the metal foil 55, as shown in FIG. 3A. Alternatively, the spacer means 60 may be an integrated part with the first metal plating layer 50' and the metal foil 55, as shown in FIGS. 3B and 3C. In a case where the spacer means 60 is in a form of the separate part which is different from the first metal plating layer 50' and the metal foil 55, it is preferred that the spacer means 60 is disposed on the first metal plating layer 50', prior to the face-to-face spaced disposing of the metal foil 55. From a viewpoint of a later forming step of a second metal plating layer, it is preferably preferred that the spacer means 60 is disposed on the first metal plating layer such that the spacer means is not overlapped with the electrode of the electronic component. For example, the spacer means may be disposed at a peripheral region of the package precursor 100'. The spacer means 60 in a form of the separate part may be made of any suitable material as long as it serves as the face-to-face spaced disposing of the metal foil 55 (with respect to the first metal plating layer). For example, the spacer means 60 in a form of the separate part may be made of a resin material. The spacer means 60 in a form of the separate part may have any suitable size. While on the other hand, in a case where the spacer means 60 has the integrated form with the first metal plating layer 50' and the metal foil 55, it is preferred that the first metal plating layer 50' or the metal foil 55 as shown in FIGS. 3B and 3C is used. Namely, "first metal plating layer 50' with at least one local protrusion 60' provided therein" or "metal foil 55 with at least one local protrusion 60' provided therein" may be used. Such protrusion 60' can be provided in the first metal plating layer or metal foil by a patterning process, a printing process with an electrically-conductive paste material, or a punching process. The shape of the protrusion 60' is not particularly limited, but may be pillar shape, conical shape, polygonal shape, or pyramid shape. The width dimension of the protrusion 60' (e.g., maximum diameter of the protrusion) is preferably in the range of 50 μm to 1 mm, and the height dimension of the protrusion 60' is preferably 100 μm or lower. A plurality of the protrusions 60' are preferably disposed such that they are spaced away from each other, in which case the spaced dimension may be in the range of 0.5 mm to 10 mm, for example.

The metal foil 55, which is disposed in the face-to-face spaced relationship, preferably has the thickness of 9 μm to 2000 μm. The thickness of the metal foil 55 may be more preferably in the range of 18 μm to 1000 μm, still more preferably in the range of 200 μm to 500 μm (for example, 300 μm). It is preferred that the metal foil 55 comprises at least one kind of metal material selected from the group consisting of Cu (copper), Ni (nickel) and Al (aluminum). By way of example, the metal foil 55 may be copper foil.

Subsequent to the step (iii), the step (iv) is carried out. Namely, as shown in FIG. 1G, a second metal plating layer 50" is formed. As shown in FIG. 1G, the second metal plating layer 50" is formed to fill a clearance between the first metal plating layer 50' and the metal foil 55 with the second metal plating layer 50", and thereby integrating the metal foil 55, the first metal plating layer 50' and the second metal plating layer 50" with each other.

It is preferred that a wet plating process is performed to form the second metal plating layer 50". Such wet plating process enables the formation of a wet plating layer filling the clearance between the first metal plating layer 50' and metal foil 55. As the wet plating process, an electroplating process (e.g., electrolytic plating process), a chemical plating process, or a hot-dip plating process may be performed.

The manufacturing method of the present invention according to an embodiment of the present invention has such a process feature that the metal layer is directly provided with respect to the exposed surface of the electrode of the electronic component. Specifically, the dry plating process is performed in the step (ii) to form the first metal plating layer 50' in contact with the exposed surface of the electrode of the electronic component, and thereafter the wet plating process is performed in the step (iv) to form the second metal plating layer 50" in contact with the first metal plating layer 50'. In particular, the second metal plating layer 50" can be provided as a thick layer. When focusing on the manufacturing processes, due to the dry plating process, the plating layer with its large thickness and having good adhesion can be formed by the subsequent wet plating process.

In the manufacturing method of the present invention according to an embodiment of the present invention, the second metal plating layer 50" is formed such that the second metal plating layer 50" fills the clearance between the first metal plating layer 50' and the metal foil 55. This enables the integration between the metal foil 55, the first metal plating layer 50' and the second metal plating layer 50". This means that the wet plating layer, i.e., the second metal plating layer 50" is formed in order to make a bonding between the first metal plating layer 50' and the metal foil 55. In this regard, the use of the metal foil 55 according to an embodiment of the present invention makes it possible to not only thicken the whole of the integrated layers due to the presence of the metal foil, but also thicken the second metal plating layer 50" (i.e., wet plating layer) serving as a bonding of the metal foil. As a result, there can be achieved a large thickness of the integrated metal part 50 as a whole, the part 50 being composed of the metal foil 55, the first metal plating layer 50' and the second metal plating layer 50".

In the step (iv), a growth plating from both surfaces of the first metal plating layer 50' and the metal foil 55 is preferably performed to form the second metal plating layer 50". Namely, it is preferred that the second metal plating layer 50" in the clearance between the first metal plating layer 50' and the metal foil 55 is formed such that the plating material grows not only from the surface of the first metal plating layer 50', but also from the surface of the metal foil 55 (see FIG. 8). This makes it possible to effectively reduce the formation time for the second metal plating layer 50" with its relatively thick form.

The integration layers provided by the step (iv), i.e., the integrated metal part 50 composed of the metal foil 55, the first metal plating layer 50' and the second metal plating layer 50" is preferably subjected to a patterning process. Specifically, as shown in FIGS. 1G and 1H, it is preferred that the patterning process of the integrated metal part 50 is performed to form a metal wiring layer 70 (wiring circuit). The patterning treatment leads to a desired wiring formation, e.g., a desired pattern formation of wirings including an extraction electrode. The patterning in itself is not particularly limited as long as it is used in the electronics packaging field. For example, a photolithography process can be available for the patterning process, in which case a formation of resist layer, an exposure to the light and subsequent development, and an etching are sequentially performed. In addition to the formation of the metal wiring layer in contact with the exposed surface of the electrode of the electronic component, a further metal wiring layer may be formed, the further layer being in no contact with the exposed surface of the electrode of the electronic component. Such further metal wiring layer enables the heat to be directly released therethrough, in addition to or instead of through the surfaces of the sealing resin and electrode of the electronic component.

The patterning process can be performed with respect to the whole of the integrated metal part 50. Alternatively, the patterning process may be preliminarily performed with respect to the constituent elements of the part 50. Specifically, the metal foil 55 may be preliminarily subjected to the patterning process, for example at a point in time before the boding process of the metal foil with the metal plating layer. Similarly, the first metal plating layer 50' may be preliminarily subjected to the patterning process, for example at a point in time before the face-to-face spaced disposing of the metal foil. Such patterning in itself is not particularly limited as long as it is used in the electronics packaging field. For example, a photolithography process can be available for the patterning process, in which case a formation of resist layer, an exposure to the light and subsequent development, and an etching are sequentially performed. As for the patterning, of the metal foil 55, the metal foil can be alternatively subjected to a machining process such as a punching process (punch cutting process).

Subsequent to the formation of the metal wiring layer 70, a resist layer 90 is preferably formed with respect to the metal plating pattern layer. For example, it is preferred as shown in FIG. 2A that a solder resist layer 90 is formed on the surface of the sealing resin layer (the surface being an exposed surface due to the peeling of the adhesive carrier) such that the metal wiring layer is partially covered with the resist layer. The formation of the resist layer 90 may be the same as that generally used in the electronics packaging field.

Through the above steps (with an additional step of the dicing operation as shown in FIG. 2B, for example), there can be finally obtained an electronic component package 100 as shown in FIG. 2C.

The manufacturing method of the present invention can be performed in various process embodiments, which will be now described below.

First Embodiment

Figure 4A:
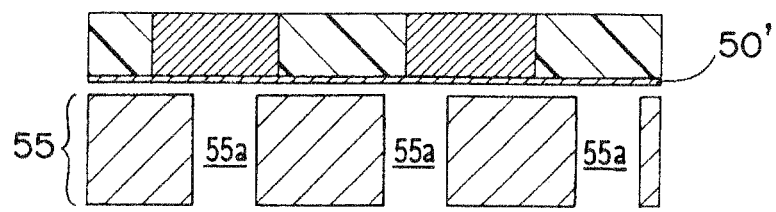
FIGS. 4A to 4C are process-cross sectional views schematically illustrating a manufacturing method of an electronic component package according to an embodiment (First Embodiment) of the present invention.

According to the first embodiment of the present invention, a metal foil having at least one through-hole 55a therein may be used as the metal foil 55 of the step (iii) (see FIG. 4A). This enables the plating solution to readily enter the clearance between the first metal plating layer 50' and the metal foil 55 via the through-hole 55a, which leads to an effective formation of the second metal plating layer 50". That is, the metal foil 55 may be equipped with the through-hole 55a therein for an effective infiltration of the plating solution for the formation of the second metal plating layer into the clearance between the first metal plating layer 50' and the metal foil 55.

Figure 4B:
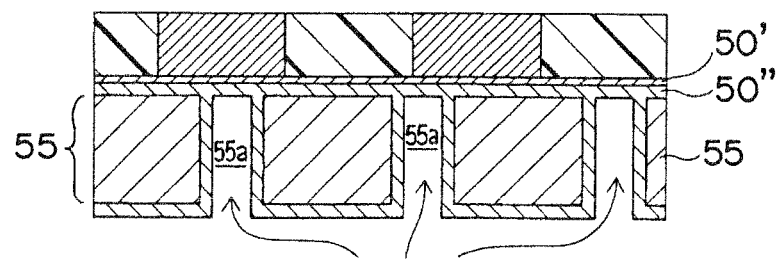
Figure 4C:
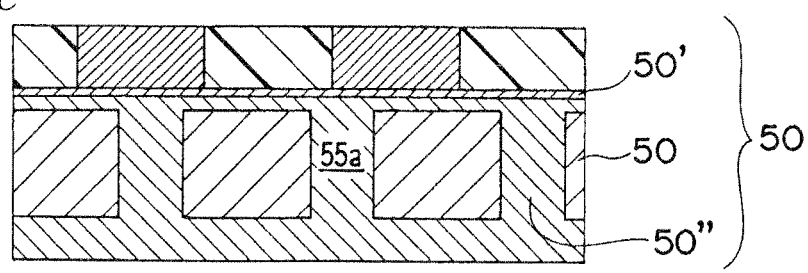

Upon the electroplating process according to the first embodiment, the plating solution passes through the through-hole 55a to spread into the clearance between the first metal plating layer 50' and the metal foil 55, which leads to the suitable formation of the second metal plating layer 50" between the first metal plating layer 50' and the metal foil 55 (see FIG. 4B). As the plating process proceeds, the formed second metal plating layer 50" gradually fills the through-hole 55a, and thereby the metal foil 55, the first metal plating layer 50' and the second metal plating layer 50" can suitably become integrated with each other. In the step (iv) according to the first embodiment, the formation of the second metal plating layer 50" can be performed such that the formed second metal plating layer 50" fills not only the clearance between the first metal plating layer 50' and the metal foil 55, but also the through-hole 55a of the metal foil 55. The filling of the through-hole 55a with the second metal plating layer 50" can be more effective when the electrolytic plating process is performed with a high rate of plating for the formation of the second metal plating layer 50".

In the case of the through-hole 55a, it is preferred that the growth plating from the inner wall surface of the through-hole 55a is performed during the formation of the second metal plating layer 50" (see FIG. 8). In other words, the growth plating is performed not only from both surfaces of the first metal plating layer 50' and the metal foil 55, but also from the inner wall surface of the through-hole 55a, which leads to the formation of the second metal plating layer 50". This makes it possible to more effectively reduce the formation time for the second metal plating layer 50" with its relatively thick form.

Figure 5A:
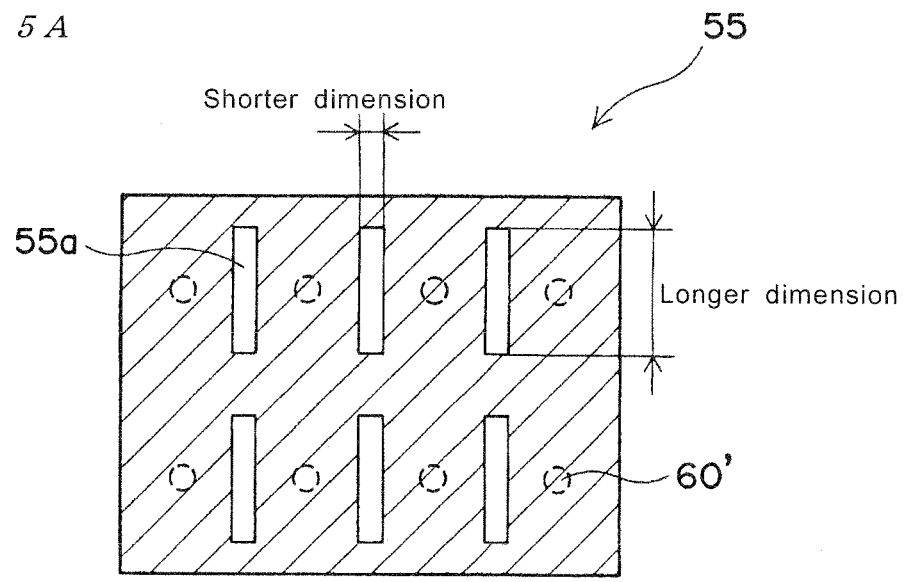
FIGS. 5A and 5B are plane views of metal foil, which schematically illustrate through-holes provided in the metal foil.
Figure 5B:
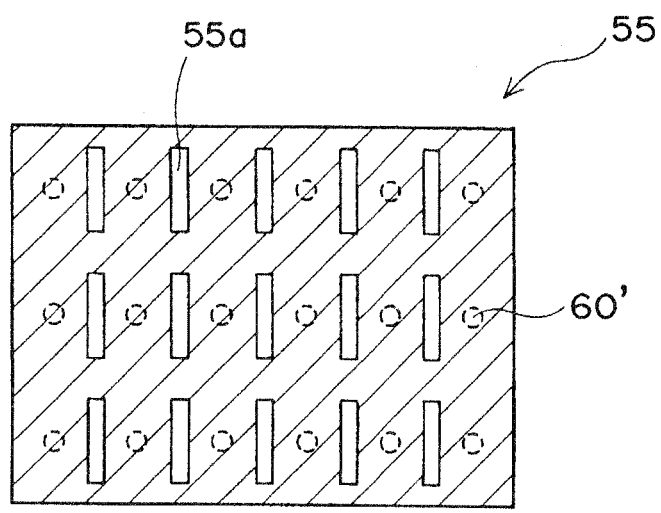

The through-hole 55a may have a suitable shape for a promoted filling due to the plating process. For example, as shown in FIGS. 5A and 5B, the through-hole 55a may have such a form that its opening shape at the principal surface of the metal foil 45 is rectangular. The through-hole 55a in itself can be formed by a machining process such as a punching process (punch cutting process). It is preferred in this case that the opening shape of the through-hole 55a, i.e., the rectangular opening of the through-hole 55a has a shorter dimension of about 0.1 mm to about 3 mm and a longer dimension of about 0.3 mm to about 20 mm (see FIG. 5A). The total area of the openings of the through-holes 55a is preferably 10% or lower with respect to the area of the principal surface of the metal foil. The through-hole 55a may have a form of mesh structure, for example.

Figure 6A:
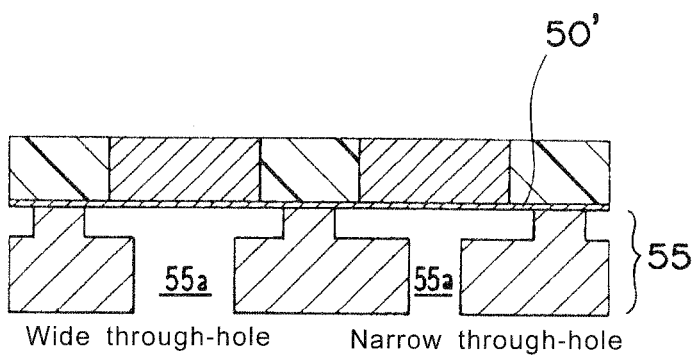
FIGS. 6A to 6C are process-cross sectional views schematically illustrating embodiments wherein the different heights of growth plating are provided due to the different sizes of the opening of the through-hole.
Figure 6B:
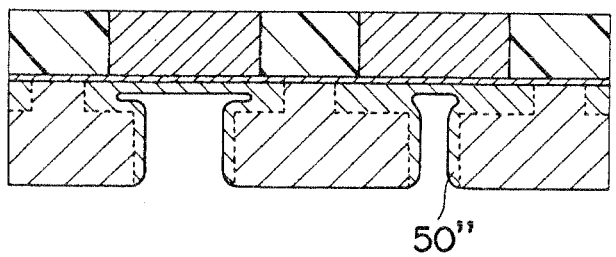
Figure 6C:
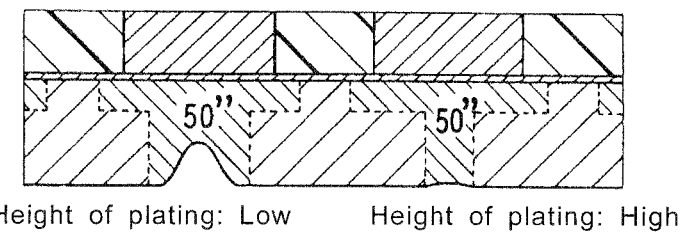

As shown in FIG. 6, the embodiment of the present invention makes it possible to change the growth height of the plating for the metal plating layer by the change of the opening size of the through-hole 55a of the metal foil 55. The difference in the size of the opening of the through-hole can cause the change of the growth level of the second metal plating layer 50" within the through-hole 55a. This is especially true for the case where the interior space of the through-hole 55a is not completely filled with the second metal plating layer 50". As shown in FIG. 6, the smaller size of the opening of the through-hole 55a enables the level of the second metal plating layer 50" in the through-hole 55a to become higher. In other words, the height level of the second metal plating layer 50" in "narrower through-hole 55a" becomes higher than that of "wider through-hole 55a" in the overall plating process.

Second Embodiment

Figure 7A:
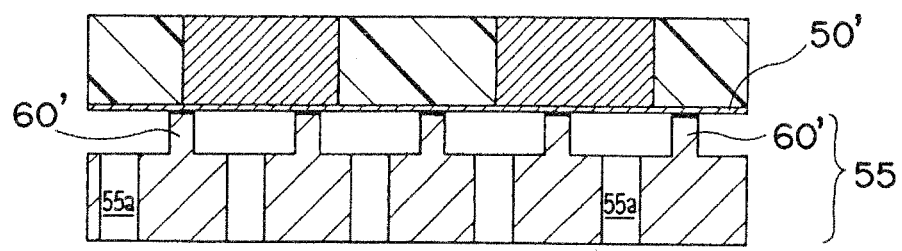
FIGS. 7A to 7C are process-cross sectional views schematically illustrating a manufacturing method of an electronic component package according to an embodiment (Second Embodiment) of the present invention.
Figure 7B:
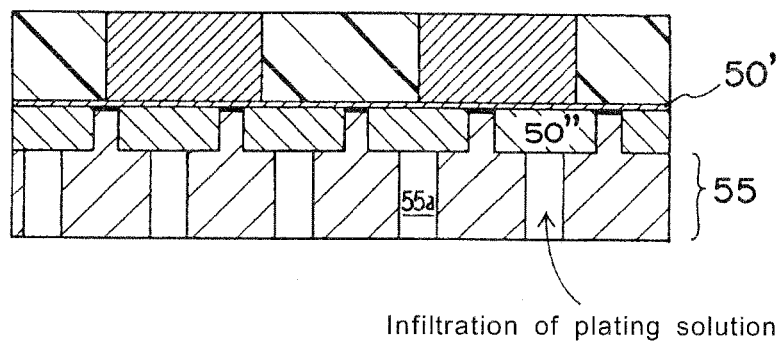
Figure 7C:
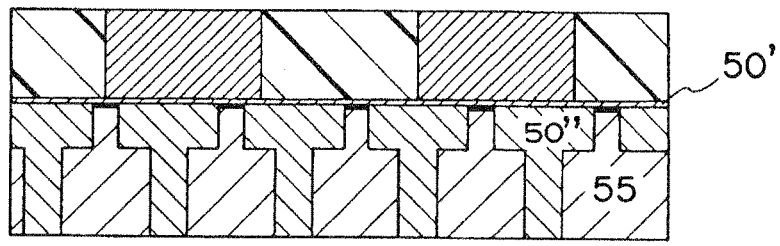
Figure 8A:
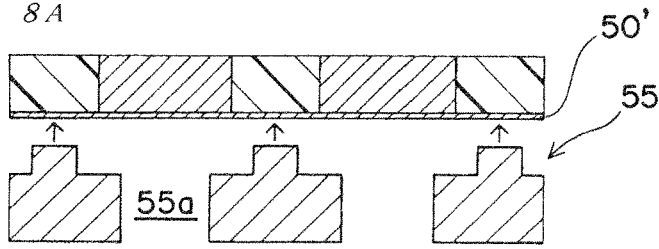
FIGS. 8A to 8E are process-cross sectional views schematically illustrating a manufacturing method of an electronic component package according to an embodiment (Second Embodiment) of the present invention.
Figure 8B:
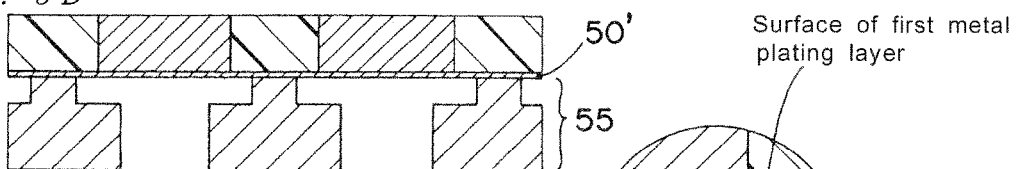
Figure 8C:
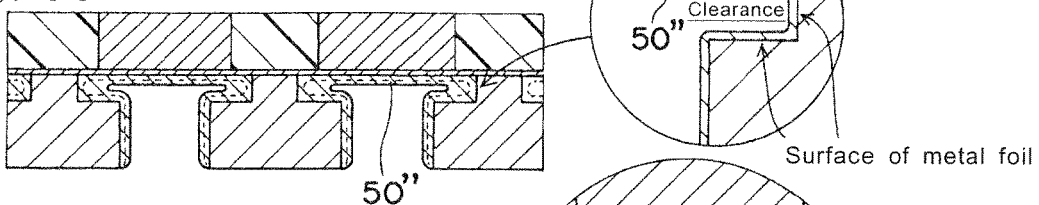
Figure 8D:
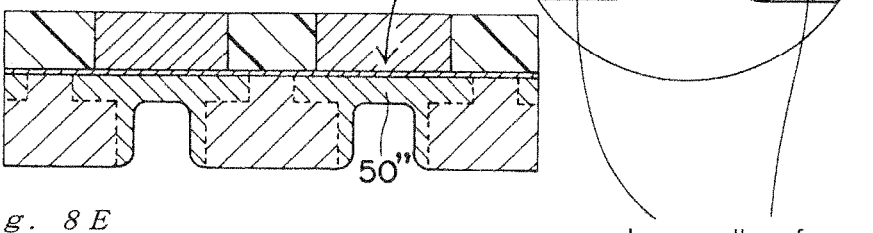
Figure 8E:
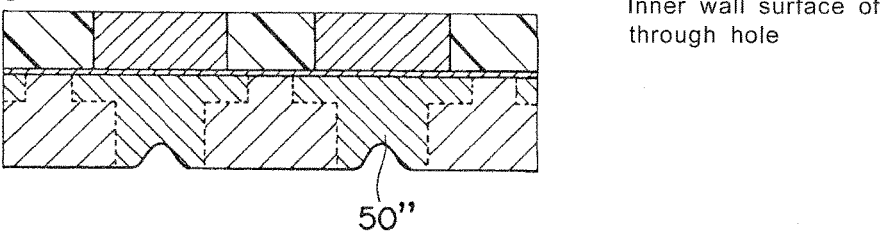

According to the second embodiment of the present invention, "metal foil with a plurality of protrusions 60' and a plurality of through-holes 55a" is used as the metal foil 55 as shown in FIGS. 7 and 8.

As shown in FIGS. 7 and 8, "a plurality of protrusions 60'" serve as the spacer means, whereas "a plurality of through-holes 55a" serve as an infiltration means for the plating solution.

Specifically, the metal foil is disposed such that the protrusions 60' thereof are positioned between the first metal plating layer 50' and the metal foil 55, and thereby the disposing of the metal foil 55 in the face-to-face spaced relationship with respect to the first metal plating layer 50' can be suitably performed. The change of the height of the protrusions 60' enables the spaced distance between the metal foil 55 and the first metal plating layer 50' to be changed.

Upon the formation of the second metal plating layer 50", the plating solution can pass through the through-holes 55a to spread into the clearance between the first metal plating layer 50' and the metal foil 55. This results in a suitable formation of the second metal plating layer 50" between the first metal plating layer 50' and the metal foil 55. Eventually, the second metal plating layer 50" is formed filling the through-holes 55a.

As seen from the partially enlarged illustration in FIG. 8, it is preferred in the step (ii) that the growth plating is performed not only from both surfaces of the first metal plating layer and the metal foil, but also from the inner wall surface of the through-hole to form the second metal plating layer 50".

Third Embodiment

Figure 9A:
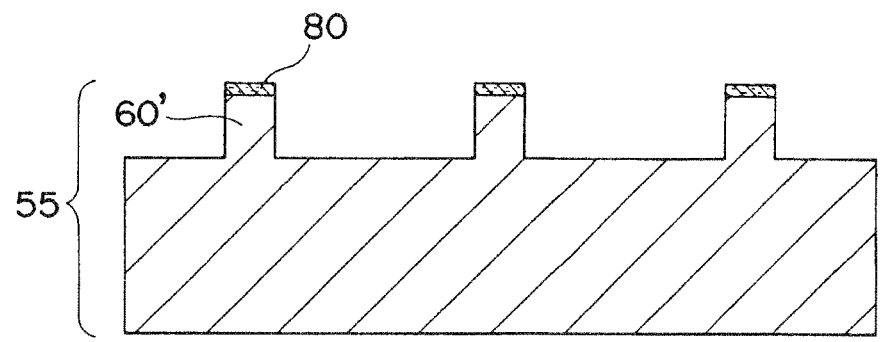
FIGS. 9A and 9B are sectional views schematically illustrating an embodiment (Third Embodiment) wherein an adhesive layer is used.
Figure 9B:
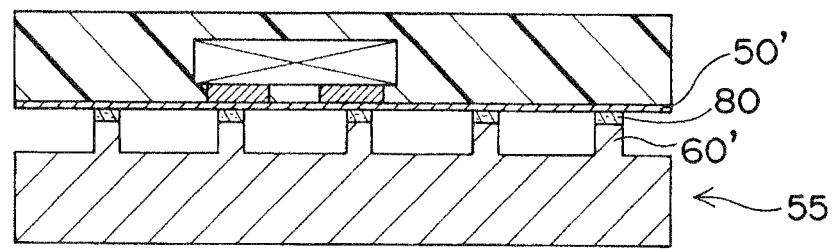

According to the third embodiment of the present invention, an adhesive layer may be used for the face-to-face disposing of the metal foil. For example, as shown in FIGS. 9A and 9B, the tip portion of the protrusion 60' (serving as the spacer means) may be provided with the adhesive layer 80. The adhesive layer 80 provided on the protrusion 60' causes the bonding between the first metal plating layer 50' and the metal foil 55 in the step (iii), and thereby the first metal plating layer 50' and the metal foil 55 are secured to each other. This means that the use of the adhesive layer 80 can increase the boding strength between the first metal plating layer 50' and the metal foil 55, which leads to a more enhanced integration between the metal foil 55, the first metal plating layer 50' and the second metal plating layer 50".

By way of example, the formation of an adhesive layer 80 can be performed by softly pressing the first metal plating layer and/or metal foil having the protrusions 60' onto a flat substrate with the adhesive agent applied thereon. This enables the adhesive layer to be provided only on each tip of the protrusions 60'. The adhesive layer may be made of a thermoplastic resin or a thermosetting resin. In a case where an insulating adhesive agent is used for the adhesive layer, the insulating adhesive layer is preferably made of at least one kind of the material selected from the group consisting of acrylic resin-based adhesive agent, urethane resin-based adhesive agent, silicone resin-based adhesive agent and epoxy resin-based adhesive agent. Alternatively, the adhesive layer may be made of at least one kind of the material selected from the group consisting of SnPb, SnAg, SnAgCu, SnAu, SnBi and the like.

Fourth Embodiment

An embodiment of the method of the present invention also makes it possible to suitably manufacture a light-emitting element package when the light-emitting element is provided as the electronic component (i.e., when the light-emitting element is included as the electronic component to be placed on the adhesive carrier). In the manufacturing of the light-emitting element package, the formations of a fluorescent layer and a transparent resin layer are performed instead of the formation of the sealing resin layer. Specifically, the fluorescent layer 44 is formed such that it surrounds the light-emitting element disposed on the adhesive layer, and thereafter the transparent resin layer 46 is formed to cover the light-emitting element and the fluorescent layer.

As a result, there can be obtained a desired light-emitting element package (see FIGS. 10A to 10I, for example). The formations of the fluorescent layer and the transparent resin layer may be similar to those generally used in a conventional LED package manufacturing.

[Electronic Component Package of the Present Invention]

An electronic component package according to an embodiment of the present invention will now be described. The electronic component package of the present invention is a package obtained by the above mentioned manufacturing method according to an embodiment of the present invention.

Figure 11:
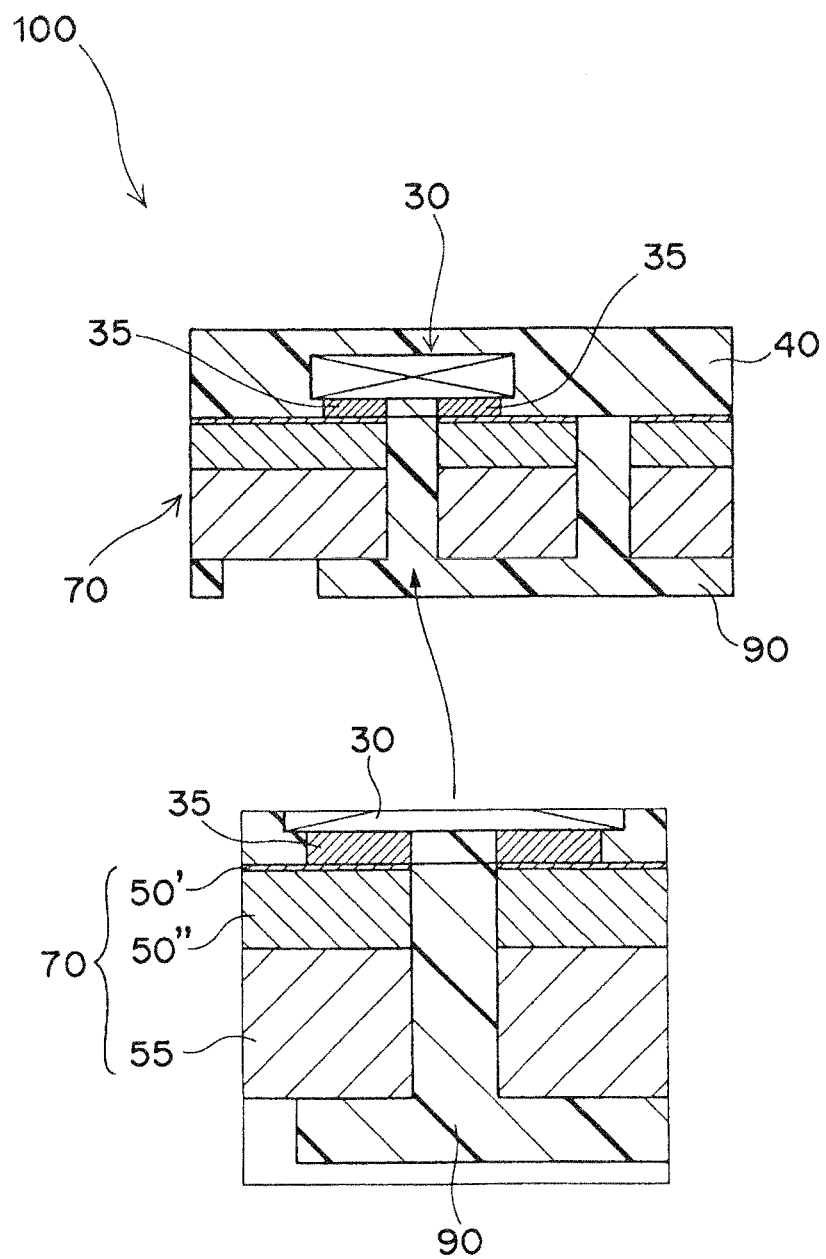
FIG. 11 are cross-sectional views schematically illustrating a configuration of an electronic component package according to an embodiment of the present invention.

FIG. 11 illustrates a configuration of the electronic component package according to an embodiment of the present invention. As shown in FIG. 11, the electronic component package 100 comprises the sealing resin layer 40, the electronic component 30 and the metal wiring layer 70.

As shown in FIG. 11, the electronic component 30 is in an embedded state in the sealing resin layer 40. In the package according to an embodiment of the present invention, the sealing resin layer 40 has the electronic component 30 therein, and the electronic component 30 is in the embedded state in the resin layer such that the electronic component 30 is flush with the sealing resin layer 40. Namely, the surface of the electronic component 30 and the surface of the sealing resin layer 40 are on substantially the same plane. More specifically, it is preferred that the electrode 35 of the electronic component is flush with the sealing resin layer 40. This means that the surface of the electrode 35 of the electronic component and the surface of the sealing resin layer 40 are preferably on substantially the same plane.

As for the electronic component 30 buried in the sealing resin layer 40, it is not limited to a single kind of the electronic component 30. Various kinds of the electronic components 30 may be provided in the sealing resin layer 40 of the electronic component package. Examples of the electronic component may include an IC (e.g., control IC), an inductor, a semiconductor element (e.g., MOS: metal-oxide semiconductor), a capacitor, a power element, a light-emitting element (e.g., LED), a chip resistor, a chip capacitor, a chip varistor, a chip thermistor and a chip laminate filter, a connection terminal and the like. According to a preferred embodiment of the present invention, the electrode 35 of the electronic component is in an exposed state at the surface of the sealing resin layer 40, and the metal wiring layer 70 is in contact with the exposed electrode 35 of the electronic component.

The sealing resin layer 40, in which the electronic component is embedded, comprises an epoxy-based resin or a silicone-based resin, for example. The thickness of the sealing resin layer 40 is preferably in the approximate range of 0.5 mm to 5.0 mm, and more preferably in the approximate range of 1.2 mm to 1.8 mm.

The metal wiring layer 70 in the electronic component package according to an embodiment of the present invention is composed of the first metal plating layer 50', the second metal plating layer 50" and the metal foil 55. Specifically, the metal wiring layer 70 is composed of "first metal plating layer 50' in direct contact with the electrode 35 of the electronic component 30", "second metal plating layer 50" in direct contact with the first metal plating layer 50'" and "metal foil 55 in direct contact with the second metal plating layer 50"". As shown in FIG. 11, the second metal plating layer 50" is located at least between the first metal plating layer 50' and the metal foil 55 in the metal wiring layer 70 of the electronic component package according to an embodiment of the present invention.

The first metal plating layer 50' is preferably a dry plating layer. Namely, it is preferred that the first metal plating layer 50' is a layer formed by a dry plating process. As such, the first metal plating layer 50' preferably comprises at least one kind of metal material selected from the group consisting of Ti (titanium), Cr (chromium), Ni (nickel) and Cu (copper). Alternatively, the first metal plating layer 50' may comprise other metal material, for example at least one kind of metal material selected from the group consisting of Ag (silver), Al (aluminum), Al alloy, Au (gold), Pt (platinum), Sn (tin), W (tungsten) and the like. While on the other hand, it is preferred that the second metal plating layer 50" is a layer formed by a wet plating process. That is, the second metal plating layer 50" is preferably a wet plating layer. As such, the second metal plating layer 50" preferably comprises at least one kind of metal material selected from the group consisting of Cu (copper) and Al (aluminum). Alternatively, the second metal plating layer 50" may comprise other metal material, for example at least one kind of metal material selected from the group consisting of Ag (silver), Pd (palladium), platinum (Pt) and nickel (Ni). However, when focusing on "heat releasing" in particular, it is preferred that the material of the second metal plating layer 50" has high thermal conductivity which effectively contributes to the heat releasing of the package. In this regard, the material of the second metal plating layer 50" preferably comprises the copper (Cu). Furthermore, in view of the package with a satisfactory connection reliability, it is preferred that the metal foil 55, the first metal plating layer 50' and the second metal plating layer 50" respectively comprise the same kind of metal material as each other. By way of example, all of the metal foil 55, the first metal plating layer 50' and the second metal plating layer 50" may at least comprise copper component, in which case the metal foil 55 may be a copper foil, the first metal plating layer 50' may be Cu thin film layer, and the second metal plating layer 50" may be a copper layer.

It should also be noted that a form of the first metal plating layer 50', i.e., the form of the dry plating layer is not limited to a single layer form, but may be a stacked-layers form. For example, the first metal plating layer 50' may have two-layered structure composed of a Ti thin film layer and a Cu thin film layer located thereon.

The metal foil 55 included in the metal wiring layer 70 preferably comprises at least one kind of metal material selected from the group consisting of Cu (copper), Al (aluminum), Ag (silver), Pd (palladium), Pt (platinum), Ni (nickel), Ti (titanium), Fe (iron), Zn (zinc), Zr (zirconium), Nb (niobium), Mo (molybdenum), Sn (tin), Ta (tantalum) and Au (gold). More preferably, the metal foil 55 may be made of Cu (copper) or Al (aluminum). The thickness of the metal foil 55 is preferably in the range of 9 μm to 2000 μm, more preferably in the range of 18 μm to 1000 μm, still more preferably in the range of 200 μm to 500 μm (for example, about 300 μm).

In the electronic component package according to an embodiment of the present invention, the relatively thick metal foil 55 is provided. Due to the thick metal foil 55, the thicker metal wiring layer 70 is suitably provided, which results in a suitable form of the wring circuit. This means that the heat from the electronic component can be suitably released via such thick metal wiring layer. In this regard, due to "surface contact" (or direct bonding/surface bonding) between the electrode surface of the electronic component and the metal plating layer, the metal wiring layer is capable of effectively releasing the heat from the electronic component via such layer to the outside. Due to the thick metal wiring layer 70, the electronic component package can have an improved mechanical strength as a whole. As such, the metal wiring layer 70 can serve as a supporting layer for the electronic component and/or the metal pattern layer. That is, the thick metal wiring layer serves not only as a supporting layer of the package, but also as a heat sink.

Due to the thick metal wiring layer 70, there can be improved the heat-releasing of the package. Accordingly, an operating lifetime and the like of the electronic component can be increased, and also degeneration and discoloration of the sealing resin, which are attributed to the heat, can be effectively prevented. Furthermore, due to the "surface contact" (or direct bonding/surface bonding), the electric resistance of the package is more desirable than that of the case of the electrical connection via bump or wire. As such, the package according to an embodiment of the present invention enables a larger electric current to be applied therein. For example, in a case of the light-emitting package (e.g., LED package), the higher luminance can be achieved due to the high heat-releasing and the large electric current.

The package according town embodiment of the present invention may be provided with a resist layer in order to achieve a more preferred form as a package product. In this regard, the electronic component package may comprise the resist layer provided with respect to the metal wiring layer. More specifically, it is preferred as shown in FIG. 11 that the solder resist layer 90 can be provided such that the metal wiring layer is partially covered with the resist layer 90. The resist layer 90 in itself may be the same as that generally provided in the electronics packaging field.

Figure 12:
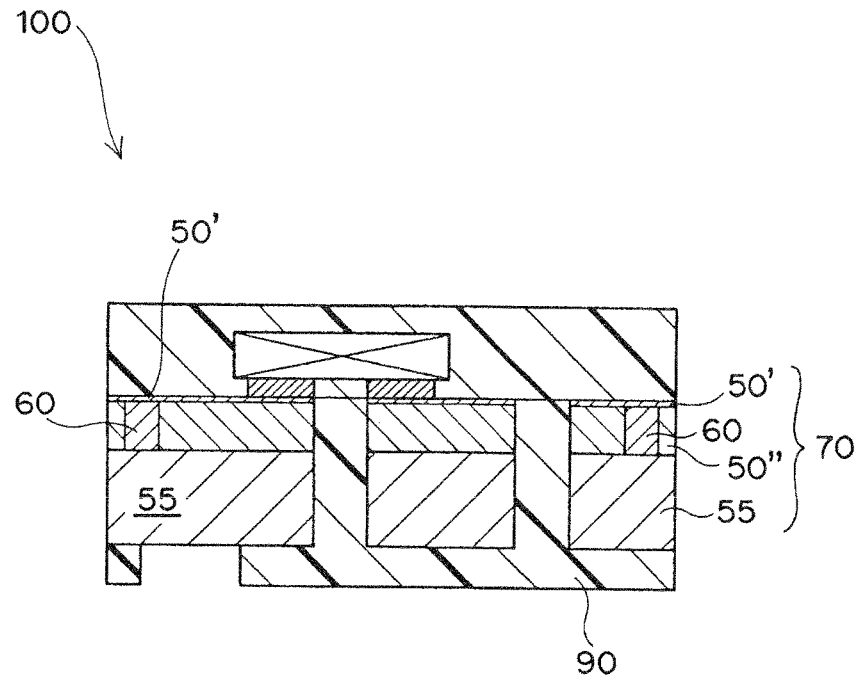
FIG. 12 is a cross-sectional view schematically illustrating a configuration of an electronic component package with a spacer means included therein according to an embodiment of the present invention.

In a case where the spacer means is used in the manufacturing method of the package, the electronic component package according to an embodiment of the present invention includes the spacer means 60 in the interior of the metal wiring layer 70 as shown in FIG. 12.

Specifically, the spacer means 60 is inter-positioned locally between the first metal plating layer 50' and the metal foil 55. For example, the spacer means 60 may serve as a stress-releasing part, and thereby there can be provided such an advantageous effect that the possible stress of the electronic component package can be reduced.

Figure 13:
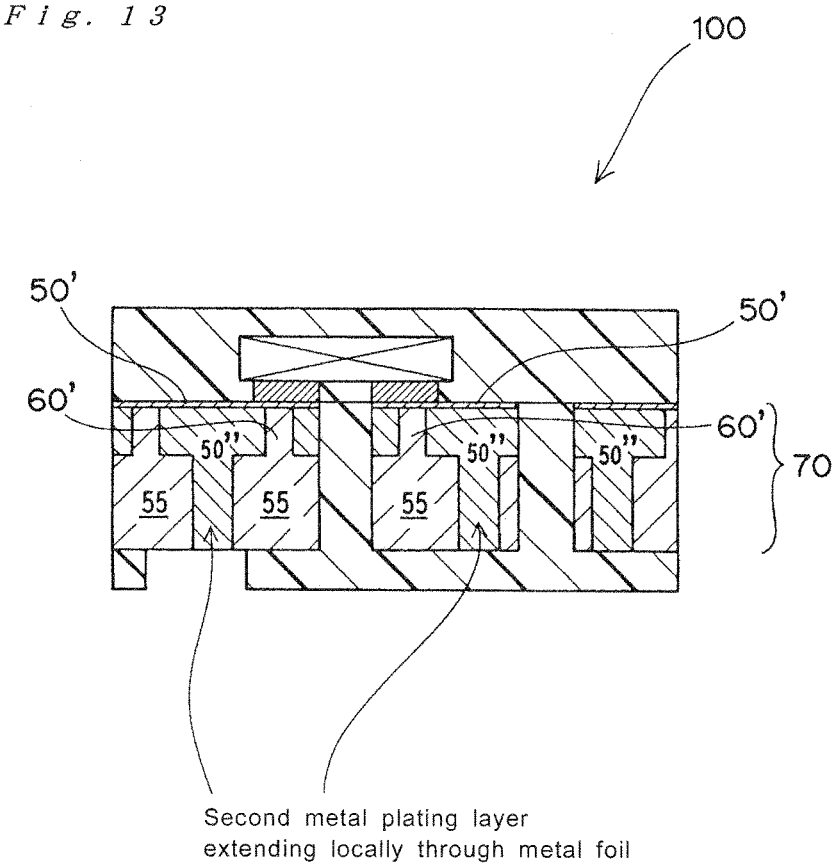
FIG. 13 is a cross-sectional view schematically illustrating a configuration of an electronic component package with a different embodiment from those of FIGS. 11 and 12 according to an embodiment of the present invention.

In a case where the spacer means 60 is used as the integrated part with the metal foil in the manufacturing method of the package (i.e., the metal foil equipped with local protrusions is used), the electronic component package according to an embodiment of the present invention may have such a form as shown in FIG. 13. That is, as shown in FIG. 13, the spacer means 60 included in the interior of the metal wiring layer 70 is a part of the metal foil 55, the part extending locally toward the first metal plating layer 50'. It is particularly preferred that the tip of the part of the metal foil 55, which part extending locally toward the first metal plating layer 50', is in contact with such first metal plating layer 50'. It should be noted that the locally extending part of the metal foil can correspond to the protrusion 60' of the metal foil 55 in the above-mentioned manufacturing method of the package, and thus such part of the metal foil may have a pillar shape, a conical shape, a polygonal shape, a pyramid shape or the like. The width dimension (e.g., maximum diameter) of the protrusion 60' of the metal foil 55 is preferably in the range of 50 μm to 1 mm, and the height dimension of the protrusion 60' is preferably 100 μm or lower. The pitch dimension of the protrusions 60' of the metal foil 55 may be in the range of 0.5 mm to 10 mm, for example.

As seen from the illustration of FIG. 13, the second metal plating layer 50" may have such a form that it additionally extends in the region other than the clearance region between the first metal plating layer 50' and the metal foil 55. More specifically, the second metal plating layer 50" may locally extend through the metal foil 55. In other words, the second metal plating layer 50" is provided not only in the clearance region between the first metal plating layer 50' and the metal foil 55, but also in the through-hole region of the metal foil 55. It should be noted that the locally extending part of the second metal plating layer 50" can correspond to the through-hole 55a of the metal foil 55 in the above-mentioned manufacturing method of the package.

Figure 14:
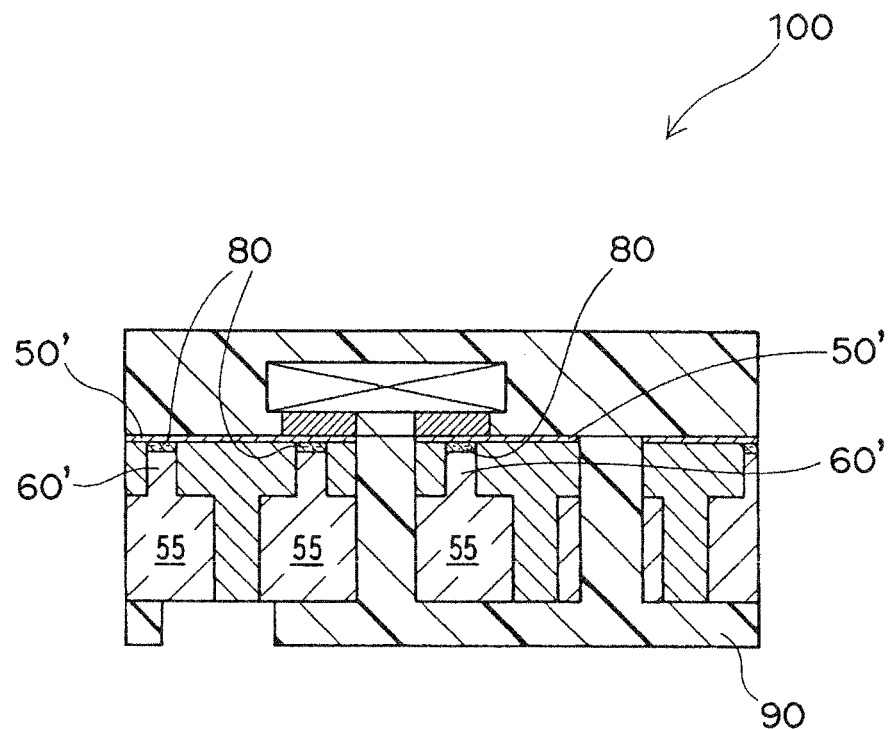
FIG. 14 is a cross-sectional view schematically illustrating a configuration of an electronic component package with a different embodiment from those of FIGS. 11 to 13 according to an embodiment of the present invention.

Furthermore, in a case where the adhesive layer is used in the manufacturing method of the package, the electronic component package according to an embodiment of the present invention may have such adhesive layer 80 in the interior of the metal wiring layer. Specifically, the adhesive layer 80 is positioned between the spacer means 60' and the first metal plating layer 50'. For example, as shown in FIG. 14, the adhesive layer 80 may be positioned between "locally extending part 60' of the metal foil 55, the part 60' extending toward the first metal plating layer 50'" and "first metal plating layer 50'". In a case where the adhesive layer 80 is an electrically conductive layer, the material of the adhesive layer 80 may consist of Ag (silver) or Sn (tin). In another case where the adhesive layer 80 is an insulating layer, the insulating adhesive layer 80 may comprise at least one kind of adhesive material selected from the group consisting of acrylic resin-based adhesive, urethane resin-based adhesive, silicone resin-based adhesive and epoxy resin adhesive. Similarly to the case of the spacer means, the adhesive layer 80 can serve as a stress-releasing part, and thereby there can be provided such an advantageous effect that the possible stress of the electronic component package can be reduced.

Figure 15:
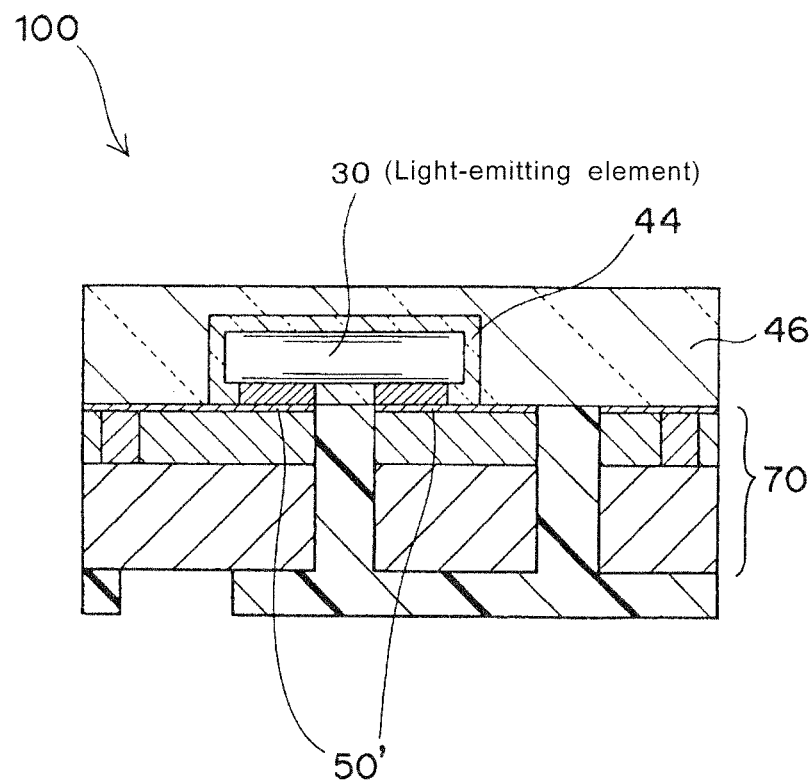
FIG. 15 is a cross-sectional view schematically illustrating a configuration of an electronic component package (especially, a light-emitting element package) according to an embodiment of the present invention.

The electronic component package according to an embodiment of the present invention can be provided as a light-emitting package. Namely, in a case where a light-emitting element is included as the electronic component, the electronic component package may have such a structure of the light-emitting package, as shown in FIG. 15. In such light-emitting package, a fluorescent layer and a transparent resin layer are preferably provided. Instead of the sealing resin layer in which the electronic component is embedded, it is preferred as shown in FIG. 15 that the fluorescent layer 44 is provided on the light-emitting element, and also the transparent resin layer 46 is provided such that the light-emitting element 30 and the fluorescent layer 44 are covered with the transparent resin layer. This makes it possible to achieve a more preferred form of the electronic component package 100 as the light-emitting element package. The material and thickness for the fluorescent layer and the transparent resin layer may be the same as those conventionally used in the general LED packages. The term "light-emitting element" used herein substantially means an element capable of emitting the light. Examples of the light-emitting element include a light-emitting diode (LED) and an electronic component equipped therewith. As such, the term "light-emitting element" as used herein means not only a "bare chip type LED (i.e., LED chip)" but also a "discrete type light-emitting element wherein a molding of the LED chip is provided". The LED chip may also be a semiconductor laser chip.

In a case of the light-emitting package as shown in FIG. 15, the dry plating layer 50' can be suitably used as a reflective layer. In this case, the reflective layer is located beneath the light-emitting element such that they are adjacent to each other. The downward light emitted from the light-emitting element can be reflected by this reflective layer (i.e., the supporter for the electronic component). As a result, the downward light emitted from the light-emitting element can be eventually reoriented upwardly by the reflective layer. When the high reflectivity is an important consideration, the dry plating layer 50' preferably comprises a metal material selected from the group of Ag (silver) and Al (aluminum).

It should be noted that the present invention as described above includes the following aspects:

The First Aspect:

A method for manufacturing an electronic component package, the method comprising the steps of:

(i) providing a package precursor in which an electronic component is embedded such that an electrode of the electronic component is exposed at a surface of a sealing resin layer;

(ii) forming a first metal plating layer such that the first metal plating layer is in contact with the exposed surface of the electrode of the electronic component;

(iii) disposing a metal foil in face-to-face spaced relationship with respect to the first metal plating layer; and (iv) forming a second metal plating layer, wherein, in the step (iv), the second metal plating layer is formed to fill a clearance between the first metal plating layer and the metal foil with the second metal plating layer, and thereby integrating the metal foil, the first metal plating layer and the second metal plating layer with each other.

The Second Aspect:

The method according to the first aspect, wherein the first metal plating layer is formed by a dry plating process, whereas the second metal plating layer is formed by a wet plating process.

The Third Aspect:

The method according to the first or second aspect, wherein, in the step (iv), a growth plating from both surfaces of the first metal plating layer and the metal foil is performed to form the second metal plating layer.

The Fourth Aspect:

The method according to any one of the first to third aspects, wherein a spacer means is used in the step (iii), in which the spacer means is locally disposed between the first metal plating layer and the metal foil, and thereby the disposing of the metal foil in the face-to-face spaced relationship with respect to the first metal plating layer is performed via the spacer means.

The Fifth Aspect:

The method according to the fourth aspect, wherein the spacer means is at least one protrusion provided in the metal foil and/or the first metal plating layer, and thereby the disposing of the metal foil in the face-to-face spaced relationship with respect to the first metal plating layer is performed via the protrusion.

The Sixth Aspect:

The method according to the fifth aspect, wherein the tip of the protrusion is provided with an adhesive layer, and the first metal plating layer and the metal foil are secured to each other by the adhesive layer in the disposing of the metal foil.

The Seventh Aspect:

The method according to any one of the first to sixth aspects, wherein the metal foil used in the step (iii) has at least one through-hole therein, and wherein the formation step (iv) of the second metal plating layer is performed to fill not only the clearance but also the through-hole with the second metal plating layer.

The Eighth Aspect:

The method according to the seventh aspect when appendant to the third aspect, wherein, in the step (iv), a growth plating is performed not only from both surfaces of the first metal plating layer and the metal foil, but also from an inner wall surface of the through-hole to form the second metal plating layer.

The Ninth Aspect:

The method according to any one of the third to eighth aspects when appendant to the second aspect, wherein a sputtering is performed as the dry plating process, whereas an electroplating is performed as the wet plating process.

The Tenth Aspect:

The method according to any one of the first to ninth aspects, wherein, subsequent to the step (iv), the integrated metal foil, first metal plating layer and second metal plating layer are subjected to a patterning process to form a metal wiring layer therefrom.

The Eleventh Aspect:

The method according to any one of the first to tenth aspects, wherein the formation step (i) of the package precursor comprises:

(a) placing the electronic component on an adhesive carrier such that the electronic component is attached to the adhesive carrier;

(b) forming a sealing resin layer on the adhesive carrier such that the electronic component is covered with the sealing resin layer; and (c) peeling away the adhesive carrier from the sealing resin layer, and thereby exposing the electrode of the electronic component at the surface of the sealing resin layer.

The Twelfth Aspect:

The method according to the eleventh aspect, wherein a light-emitting element is included as the electronic component to be placed in the step (a); and instead of forming the sealing resin layer in the step (b), a fluorescent layer is formed on the light-emitting element, and thereafter a transparent resin layer is formed to cover the light-emitting element and the fluorescent layer.

The Thirteenth Aspect:

An electronic component package, comprising:

a sealing resin layer;

an electronic component buried in the sealing resin layer; and a metal wiring layer in contact with an electrode of the electronic component, wherein the metal wiring layer is composed of a first metal plating layer, a second metal plating layer and a metal foil, the first metal plating layer being in direct contact with the electrode of the electronic component, the second metal plating layer being in direct contact with the first metal plating layer, the metal foil being in direct contact with the second metal plating layer, and wherein the second metal plating layer is positioned at least between the first metal plating layer and the metal foil.

The Fourteenth Aspect:

The electronic component package according to the thirteenth aspect, wherein the first metal plating layer is a dry plating layer, whereas the second metal plating layer is a wet plating layer.

The Fifteenth Aspect:

The electronic component package according to the thirteenth or fourteenth aspect, wherein the second metal plating layer extends locally through the metal foil.

The Sixteenth Aspect:

The electronic component package according to any one of the thirteenth to fifteenth aspects, wherein a spacer means is inter-positioned between the first metal plating layer and the metal foil.

The Seventeenth Aspect:

The electronic component package according to the sixteenth aspect, wherein the spacer means is a part of the metal foil, the part extending locally toward the first metal plating layer.

The Eighteenth Aspect:

The electronic component package according to the sixteenth or seventeenth aspect, further comprising an adhesive layer between the spacer means and the first metal plating layer.

The Nineteenth Aspect:

The electronic component package according to any one of the thirteenth to eighteenth aspects, wherein the metal foil has a thickness of 18 μm to 1000 μm.

The Twentieth Aspect:

The electronic component package according to any one of the thirteenth to nineteenth aspects, wherein the first metal plating layer comprises at least one kind of a metal material selected from a group consisting of Ti, Cr, Ni and Cu, the metal foil comprises at least one kind of a metal material selected from a group consisting of Cu and Al, and the second metal plating layer comprises at least one kind of a metal material selected from a group consisting of Cu, Ni and Al.

The Twenty-First Aspect:

The electronic component package according to any one of the thirteenth to twentieth aspects, wherein a light-emitting element is provided as the electronic component.

While some embodiments of the present invention have been hereinbefore described, they are merely the typical embodiments. It will be readily appreciated by those skilled in the art that the present invention is not limited to the above embodiments, and that various modifications are possible without departing from the scope of the present invention.

For example, the peeled adhesive carrier, which has been already removed from the precursor, may be re-used. That is, the used adhesive carrier can be available for the manufacturing of another electronic component package at a later stage.

For example, an alignment mark may be preliminarily provided on the adhesive carrier in order to recognize the positioning of the electronic component 30 upon the formation of the precursor 100' of electronic component package. A layer of the alignment mark may be attached to the adhesive carrier prior to the placement of the electronic component 30.

EXAMPLES

The electronic component package was manufactured according to an embodiment of the present invention. As a supporting base of adhesive carrier, SUS304 plate (about 100 mm×about 100 mm-about 1.0 mm in thickness) was used. An adhesive layer of an adhesive film (i.e., double faced film composed of adhesive layer, PET film and subtle adhesive layer/about 100 mm×about 100 mm-about 150 μm in thickness) was attached to the supporting base to provide an adhesive carrier.

Next, an electronic component was placed on the adhesive carrier while regarding a center point of the adhesive carrier as the reference point. That is, a mounting process of the electronic component was performed.

Next, the amount of a sealing resin material (liquid epoxy resin material) was metered in accordance with the mounting number of the package component, followed by being supplied onto the carrier (on which the electronic component had been mounted) to be subjected to a vacuum degassing process. The carrier was put into a heat-press apparatus, and then the sealing resin material was subjected to a semi-curing process by a heat press. The resulting electronic component-sealing body was taken out of the apparatus. Thereafter, the sealing resin of the body was subjected to a complete curing process by a drying device.

Next, the adhesive carrier was peeled away from the electronic component-sealing body with the electronic component buried in the sealing resin thereof. The electronic component-sealing body was then subjected to washing and drying treatments. As a result, there was obtained a package precursor.

The package precursor was put into a sputter apparatus to be subjected to a plating process. The plating process resulted in the formation of the Ti sputter layer with its thickness of about 30 nm and the Cu sputter layer with its thickness of about 100 nm.

The metal foil was disposed in the face-to-face spaced relationship with respect to the sputter layers. The metal foil to be disposed had through-holes and protrusions therein. In this regard, the copper foil with its thickness of about 0.2 mm was subjected to a resist formation process, a development, an etching, and a peeling removal treatment to provide the through-holes and protrusions in such foil. Each of the through-holes had a rectangular opening of about 0.5 mm×about 0.5 mm, and pitch of the through-holes was about 5 nm. The protrusion had a pillar form with its diameter dimension of about 0.3 mm and its height dimension of about 80 μm.

The tip of the protrusion of the metal foil was provided with an adhesive layer. Specifically, Ag paste material was applied onto a glass substrate by a doctor blade process to form Ag paste material layer with its thickness of about 50 μm. Thereafter, the protrusions of the metal foil were softly put onto the Ag paste material layer, and thereby the adhesive layer was provided on the tip of the protrusion of the metal foil. The metal foil with the adhesive layer was attached to the package precursor, followed by being subjected to a firing treatment for curing in the nitrogen atmosphere. This enabled the metal foil to be secured to the package precursor.

The package precursor with the metal foil secured thereto was subjected to an electrolytic copper plating process to form an electrolytic copper plating layer filling "clearance between the metal foil and the sputter layer" and "through-holes of the metal foil". The formation of the electrolytic copper plating layer caused the metal foil, the sputter layer and the electrolytic copper plating layer to be integrated with each other. The integrated metal part was then subjected to a patterning process to form a metal wiring layer.

Next, a print photosensitive solder paste was supplied, followed by being subjected to a curing process thereof. Finally, a cutting process was performed by a dicer device to provide an electronic component package with a desired size.

As a result of the above processes, there was able to be obtained the package with "substrate-less", "wire bonding-less/bump-less", "solder material-less". It was confirmed that the bump-less metal plating layer together with the thick metal foil had been integrated with respect to "exposed surface of electrode of electronic component", the metal plating layer and the metal foil being capable of serving suitably as a heat sink.

INDUSTRIAL APPLICABILITY

The present invention can be suitably used in various applications of electronics packaging field. For example, the present invention can be suitably available in an electric source package (e.g., POL converter such as voltage step down DC-DC converter), a LED package, a module with a built-in component.

CROSS REFERENCE TO RELATED PATENT APPLICATION

The present application claims the right of priority of Japan patent application No. 2012-279972 (filing date: Dec. 21, 2012, title of the invention: ELECTRONIC COMPONENT PACKAGE AND METHOD FOR MANUFACTURING THE SAME), the whole contents of which are incorporated herein by reference.

EXPLANATION OF REFERENCE NUMERALS

20 Adhesive carrier
24 Supporting base of adhesive carrier
26 Adhesive layer of adhesive carrier
30 Electronic component
35 Electrode of electronic component
40 Sealing resin layer
50' First metal plating layer
50" Second metal plating layer
55 Metal foil
55a through-hole
60 Spacer means
60' Local protrusion serving as spacer means
70 Metal wiring layer
80 Adhesive layer
90 Resist layer
100' Precursor of electronic component package
100 Electronic component package

The invention claimed is:

1. A method for manufacturing an electronic component package, the method comprising the steps of:
   (i) providing a package precursor in which an electronic component is embedded such that an electrode of the electronic component is exposed at a surface of a sealing resin layer;
   (ii) forming a first metal plating layer such that the first metal plating layer is in contact with the exposed surface of the electrode of the electronic component;
   (iii) disposing a metal foil in face-to-face spaced relationship with respect to the first metal plating layer, wherein a spacer is disposed between the first metal plating layer and the metal foil to form a space therebetween; and
   (iv) forming a second metal plating layer, wherein, in the step (iv), the second metal plating layer is formed to fill the space between the first metal plating layer and the metal foil with the second metal plating layer, the space having been provided by the spacer, thereby integrating the metal foil, the first metal plating layer and the second metal plating layer with each other.

2. The method according to claim 1, wherein the metal foil used in the step (iii) has at least one through-hole therein, and wherein the formation step (iv) of the second metal plating layer is performed to fill not only the space but also the through-hole with the second metal plating layer.

3. The method according to claim 2, wherein, in the step (iv), a growth plating from both surfaces of the first metal plating layer and the metal foil is performed to form the second metal plating layer, and the growth plating for the formation of the second metal plating layer is performed not only from the both surfaces of the first metal plating layer and the metal foil, but also from an inner wall surface of the through-hole.

4. The method according to claim 1, wherein the first metal plating layer is formed by a dry plating process, whereas the second metal plating layer is formed by a wet plating process, and wherein a sputtering is performed as the dry plating process, whereas an electroplating is performed as the wet plating process.

5. The method according to claim 1, wherein the formation step (i) of the package precursor comprises:
   (a) placing the electronic component on an adhesive carrier such that the electronic component is attached to the adhesive carrier;
   (b) forming a sealing resin layer on the adhesive carrier such that the electronic component is covered with the sealing resin layer; and
   (c) peeling away the adhesive carrier from the sealing resin layer, and thereby exposing the electrode of the electronic component at the surface of the sealing resin layer.

6. The method according to claim 5, wherein a light-emitting element is included as the electronic component to be placed in the step (a), and instead of forming the sealing resin layer in the step (b), a fluorescent layer is formed on the light-emitting element, and thereafter a transparent resin layer is formed to cover the light-emitting element and the fluorescent layer.

7. The method according to claim 1, wherein the first metal plating layer is formed by a dry plating process, and the second metal plating layer is formed by a wet plating process.

8. The method according to claim 1, wherein, in the step (iv), a growth plating from both surfaces of the first metal plating layer and the metal foil is performed to form the second metal plating layer and thereby fill the space provided by the spacer.

9. The method according to claim 1, wherein the spacer comprises at least one protrusion formed as part of the first metal plating layer.

10. The method according to claim 1, wherein the spacer comprises at least one protrusion formed as part of the metal foil.

11. The method according to claim 1, wherein the spacer is disposed between the first metal plating layer and the metal foil such that the spacer is not overlapped by the electrode of the electronic component.

12. A method for manufacturing an electronic component package, the method comprising:
   (i) providing a package precursor in which an electronic component is embedded in a sealing resin layer such that an electrode of the electronic component is exposed at a surface of the sealing resin layer;
   (ii) providing a first metal plating layer such that the first metal plating layer is in contact with the exposed surface of the electrode of the electronic component;
   (iii) disposing a metal foil in face-to-face spaced relationship with respect to the first metal plating layer, wherein at least one protrusion is disposed between the first metal plating layer and the metal foil to form a space therebetween; and (iv) forming a second metal plating layer, wherein the second metal plating layer is formed so as to fill the space provided by the at least one protrusion between the first metal plating layer and the metal foil, thereby integrating the metal foil, the first metal plating layer and the second metal plating layer with each other.

13. The method according to claim 12, wherein the at least one protrusion comprises a plurality of protrusions formed as part of the first metal plating layer.

14. The method according to claim 12, wherein the at least one protrusion comprises a plurality of protrusions formed as part of the metal foil.

* * * * *